(12) United States Patent
Caraveo et al.

(10) Patent No.: US 10,062,832 B2
(45) Date of Patent: Aug. 28, 2018

(54) METHODS AND SYSTEMS FOR MAKING PIEZOELECTRIC CANTILEVER ACTUATORS

(71) Applicant: Sabic Global Technologies, B.V., Bergen op Zoom (NL)

(72) Inventors: Jesus Alfonso Caraveo, Thuwal (SA); Ibrahim Al-Howaish, Jeddah (SA); Mahmoud N. Almadhoun, Thuwal (SA); Abdulaziz Hamad M. Aldubayan, Thuwal (SA)

(73) Assignee: Sabic Global Technologies, B.V., Bergen op Zoom (NL)

( * ) Notice: Subject to any disclaimer, the term of this patent is extended or adjusted under 35 U.S.C. 154(b) by 143 days.

(21) Appl. No.: 15/334,759

(22) Filed: Oct. 26, 2016

(65) Prior Publication Data

US 2017/0155038 A1    Jun. 1, 2017

Related U.S. Application Data

(60) Provisional application No. 62/260,982, filed on Nov. 30, 2015.

(51) Int. Cl.
*H01L 21/00*     (2006.01)
*H01L 41/314*    (2013.01)
(Continued)

(52) U.S. Cl.
CPC .......... *H01L 41/314* (2013.01); *H01L 41/094* (2013.01); *H01L 41/29* (2013.01)

(58) Field of Classification Search
CPC ................ B81C 1/00936; B81C 3/008; B81C 1/00–1/0092; B81C 2201/014;
(Continued)

(56) References Cited

U.S. PATENT DOCUMENTS 4,981,552 A * 1/1991 Mikkor ............... G01P 15/0802
                                                 310/311
5,610,335 A    3/1997 Shaw et al.
(Continued)

FOREIGN PATENT DOCUMENTS

CN       103594617 A1    2/2014
EP         3841165 B1    3/2006
(Continued)

OTHER PUBLICATIONS

Fadel-Taris, L., et al., "Organic microcantilevers fabrication based on a technique adapted from flip chip for biosensing application," Proceedings Journées Nationales sur les technologies Emergentes en Micronanofabrication, 2010, 2 pages.
(Continued)

*Primary Examiner* — Kevin M Picardat
(74) *Attorney, Agent, or Firm* — Conley Rose, P.C.; Rodney B. Carroll

(57) ABSTRACT

A method of fabricating a microelectronic device comprising providing a substrate comprising a first bottom surface, providing a mold comprising a first top surface with first projections, and punching the first projections through the first bottom surface to define anchors, pre-cantilevers, and cavities in the substrate. A piezoelectric cantilever actuator system array prepared by a process comprising the steps of providing a substrate comprising a first bottom surface, providing a mold comprising a first top surface with first projections, and punching the first projections through the first bottom surface to define anchors, pre-cantilevers, and cavities in the substrate. A microelectronic device comprising a base, a first anchor coupled to the base, and a first cantilever coupled to the first anchor, wherein the base, the first anchor, and the first cantilever are an integral structure formed from the same substrate material.

16 Claims, 18 Drawing Sheets

(51) Int. Cl.
*H01L 41/29* (2013.01)
*H01L 41/09* (2006.01)

(58) Field of Classification Search
CPC ......... B81C 2203/0118; H01L 41/1136; H01L 41/00–41/1138; H01L 27/20; B81B 2203/0315
USPC .................................. 438/52; 257/415, 417
See application file for complete search history.

(56) References Cited

U.S. PATENT DOCUMENTS

| | | | |
|---|---|---|---|
| 7,104,134 B2 | 9/2006 | Amano et al. | |
| 7,253,488 B2* | 8/2007 | Zhan | B81B 3/0021 257/414 |
| 7,763,947 B2* | 7/2010 | Zhan | B81B 3/0021 257/417 |
| 8,120,232 B2* | 2/2012 | Daniel | G01L 1/16 310/330 |
| 8,389,862 B2* | 3/2013 | Arora | H01L 23/4985 174/254 |
| 2010/0193469 A1* | 8/2010 | Lee | B81C 1/0046 216/49 |
| 2015/0203345 A1 | 7/2015 | Sachin et al. | |

FOREIGN PATENT DOCUMENTS

| | | |
|---|---|---|
| KR | 1303495 B1 | 9/2013 |
| KR | 101571451 B1 | 11/2015 |

OTHER PUBLICATIONS

Fu, Y., et al., "Design, fabrication and testing of piezoelectric polymer PVDF microactuators," Smart Materials and Structures, 2016, pp. S141-S146, vol. 15, IOP Publishing, Ltd, UK.

Fu, Y., et al., "Design, Modelling and Simulation of Piezoelectric Actuators," Smart Mater. 2006, pp. 211-217.

Viahale, B. P., et al., "PVdF Based Micro Actuator," 2012 1st International Symposium on Physics and Technology of Sensors (ISPTS), 2012, pp. 59-62.

Oh, S, R., et al., "Fabrication of piezoelectric P(VDF-TrFE) microcantilevers by wafer-level surface micromachining," Journal of Micromechanics and Microengineering, 2013, 11 pages, vol. 23, IOP Publishing, Ltd, UK.

Tang, Y., et al., "Fabrication and characterization of SiO2 microcantilever for microsensor application," Sensors and Actuators B, 2004, pp. 109-113, vol. 97, Elsevier, B.V.

Watanabe, S., et al., "Micro-fabricated piezoelectric cantilever for atomic force microscopy," Review of Scientific Instruments, 1996, pp. 3898-3903, vol. 67, No. 11., American Institute of Physics.

Yamagata, Y., et al., "A New Fabrication Method for Micro Actuators with Piezoelectric Thin Film using Precision Cutting Technique," IEEE, 1996, pp. 307-311.

Filing Receipt and Specification of International Application No. PCT/IB2016/056487 filed Oct. 27, 2016, entitled, "Methods and Systems for Making Piezoelectric Cantilever Actuators," 42 pages.

Filing Receipt and Specification of U.S. Appl. No. 62/260,982, filed Nov. 30, 2015, entitled, "Methods and Systems for Making Piezoelectric Cantilever Actuators," 57 pages.

Filing Receipt and Specification of U.S. Appl. No. 62/185,506, filed Jun. 26, 2015, entitled, "Integrated Piezoelectric Cantilever Actuator and Transistor for Touch Input and Haptic Feedback Applications," 46 pages.

Foreign communication from a related counterpart application International Application No. PCT/IB2016/056487. International Search Report and Written Opinion, dated Jan. 23, 2017, 10 pages.

\* cited by examiner

METHODS AND SYSTEMS FOR MAKING PIEZOELECTRIC CANTILEVER ACTUATORS

CROSS-REFERENCE TO RELATED APPLICATIONS

The present application is a non-provisional of and claims priority to U.S. Provisional Patent Application No. 62/260,982 filed Nov. 30, 2015 and entitled "Methods and Systems for Making Piezoelectric Cantilever Actuators," which application is incorporated by reference herein in its entirety.

TECHNICAL FIELD

The present disclosure relates to microelectronics fabrication, more specifically to processes for fabricating piezoelectric cantilever actuators.

BACKGROUND

Electronic devices interact, or communicate, with users of the devices by receiving input from the users and providing output to the users. Conventional forms of input include keyboards, mice, and touchscreens. Conventional forms of output include digital displays, toggle lights, and liquid crystal displays (LCDs).

Haptic communication refers to interaction with users by recreating the sense of touch by applying forces, vibrations, or motions to the users. For instance, some smartphones include rotating mass motors that vibrate when users touch screens on the smartphones or when users receive notifications of incoming calls, text messages, or emails. However, those motors cannot localize vibrations to any particular locations of the smartphones. Furthermore, the motors are large and limit the physical dimensions of smartphones. Additionally, the motors consume significant power, particularly in comparison to their functional benefit and to other components in the smartphones.

Capacitive sensing refers to interaction with users based on the body capacitance of users. For instance, when users touch a smartphone touchscreen, sensors underneath the touchscreen detect changes in capacitance from the touch. A processor then correlates the changes in capacitance to locations of the touchscreen. However, capacitive sensing is not able to quantify the pressure from touch. Moreover, capacitive sensors do not combine well with haptic motors because the sensors and motors must be separated physically and because the motors cannot localize vibrations to where the sensors sense touch. Thus, capacitive sensing input cannot correlate well to haptic vibration output.

BRIEF SUMMARY

Disclosed herein is a method of fabricating a microelectronic device comprising providing a substrate comprising a first bottom surface, providing a mold comprising a first top surface with first projections, and punching the first projections through the first bottom surface to define anchors, pre-cantilevers, and cavities in the substrate.

Also disclosed herein is a piezoelectric cantilever actuator system array prepared by a process comprising the steps of providing a substrate comprising a first bottom surface, providing a mold comprising a first top surface with first projections, and punching the first projections through the first bottom surface to define anchors, pre-cantilevers, and cavities in the substrate.

Further disclosed herein is a microelectronic device comprising a base, a first anchor coupled to the base, and a first cantilever coupled to the first anchor, wherein the base, the first anchor, and the first cantilever are an integral structure formed from the same substrate material.

BRIEF DESCRIPTION OF THE DRAWINGS

For a detailed description of the preferred embodiments of the disclosed methods, reference will now be made to the accompanying drawings in which.

DETAILED DESCRIPTION

Figure 1A:
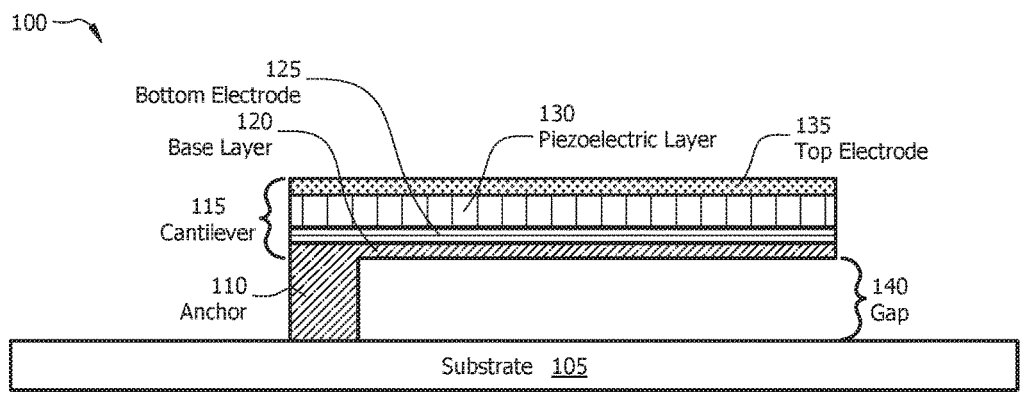
FIG. 1A is a side view of a schematic diagram of a piezoelectric cantilever actuator.

Disclosed herein are microelectronic manufacturing methods, techniques, and systems. While any number and variety of microelectronics may be prepared using the methods, techniques, and systems described herein, for ease of reference the specification will focus on piezoelectric cantilever actuators and techniques for fabricating those actuators. The actuators comprise a base, a first anchor coupled to the base, and a first cantilever coupled to the first anchor, wherein the base, the first anchor, and the first cantilever are part of the same substrate. Fabrication of the actuators comprises providing a substrate comprising a first bottom surface, providing a mold comprising a first top surface with first projections, and punching the first projections through the first bottom surface to define anchors, pre-cantilevers, and cavities in the substrate. Fabrication of the actuators further comprises providing a cutter with a second bottom surface with second projections, and stamping a second top surface of the substrate to release the pre-cantilevers and define cantilevers and recess areas. Optionally, fabrication of the actuators further comprises fabricating additional circuitry on top of the pre-cantilevers prior to and/or after any of the providing the substrate, the providing the mold, and the punching.

Other than in the operating examples or where otherwise indicated, all numbers or expressions referring to quantities of ingredients, reaction conditions, and the like, used in the specification and claims are to be understood as modified in all instances by the term "about." Various numerical ranges are disclosed herein. Because these ranges are continuous, they include every value between the minimum and maximum values. The endpoints of all ranges reciting the same characteristic or component are independently combinable and inclusive of the recited endpoint. Unless expressly indicated otherwise, the various numerical ranges specified in this application are approximations. The endpoints of all ranges directed to the same component or property are inclusive of the endpoint and independently combinable. The term "from more than 0 to an amount" means that the named component is present in some amount more than 0, and up to and including the higher named amount.

The terms "a," "an," and "the" do not denote a limitation of quantity, but rather denote the presence of at least one of the referenced item. As used herein the singular forms "a," "an," and "the" include plural referents.

As used herein, "combinations thereof" is inclusive of one or more of the recited elements, optionally together with a like element not recited, e.g., inclusive of a combination of one or more of the named components, optionally with one or more other components not specifically named that have essentially the same function. As used herein, the term "combination" is inclusive of blends, mixtures, alloys, reaction products, and the like.

Reference throughout the specification to "an embodiment," "another embodiment," "other embodiments," "some embodiments," and so forth, means that a particular element (e.g., feature, structure, property, and/or characteristic) described in connection with the embodiment is included in at least one embodiment described herein, and may or may not be present in other embodiments. In addition, it is to be understood that the described element(s) can be combined in any suitable manner in the various embodiments.

As used herein, the terms "inhibiting" or "reducing" or "preventing" or "avoiding" or any variation of these terms, include any measurable decrease or complete inhibition to achieve a desired result.

As used herein, the term "effective," means adequate to accomplish a desired, expected, or intended result.

As used herein, the terms "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains") are inclusive or open-ended and do not exclude additional, unrecited elements or method steps.

As used herein, the term "thermoplastic" refers to a plastic or polymeric material capable of undergoing plastic deformation under the conditions described herein, examples including polyethylene terephthalate (PET), polyester, polyolefin (e.g., polyethylene, polypropylene, etc.), polycarbonate, polyacetal, polyacrylates, polyacrylonitrile, polyamide, polyamide-imide, polyaryletherketone, polybutadiene, polybutylene, polybutylene terephthalate, polychlorotrifluoroethylene, polycyclohexylene dimethylene terephthalate, polyhydroxyalkanoates, polyketone, polyethylene, polyethereetherketone, polyetherimide, polyetheresulfone, polyethylenechlorinate, polyimide, polylactic acid, polymethylpentene, polyphenylene oxide, polyphenylene sulfide, polyphthalamide, polypropylene, polysulfone, polyvinyl chloride, polyvinylidene chloride, acrylonitrile butadiene styrene, celluloid, cellulose acetate, ethylene vinyl acetate, ethylene vinyl alcohol, fluoroplastics, ionomers, and combinations thereof.

Unless defined otherwise, technical and scientific terms used herein have the same meaning as is commonly understood by one of skill in the art.

FIG. 1A is a side view of a schematic diagram of a piezoelectric cantilever actuator 100. Piezoelectric is the property of converting a mechanical force to an electric charge. A cantilever is a long projecting beam fixed at only one end. In this context, an actuator is a device that converts electrical charge to mechanical force. The actuator 100 comprises a substrate 105, an anchor 110, and a cantilever 115.

The substrate 105 comprises a material such as plastic suitable for providing support for the actuator 100 in general during fabrication and the anchor 110 in particular after fabrication. The anchor 110 comprises a material suitable for providing support for the cantilever 115. The anchor further provides a gap 140 for the cantilever 115 to move up and down.

The cantilever 115 comprises a base layer 120, a bottom electrode 125, a piezoelectric layer 130, and a top electrode 135. The base layer 120 comprises a material suitable for providing support for the bottom electrode 125, the piezoelectric layer 130, and the top electrode 135. The substrate 105, the anchor 110, and the base layer 120 may comprise similar materials. For example the substrate 105, the anchor 110, and the base layer 120 may comprise the same material and may be an integral, unitary, continuous structure formed from a common substrate material as described in more detail herein. The bottom electrode 125 and the top electrode 135 comprise a material suitable for electrical conductivity. The piezoelectric layer 130 comprises a piezoelectric material suitable for converting a mechanical force to an electric charge and for passing that electric charge on to the bottom electrode 125 and the top electrode 135.

The actuator 100 provides two functions. First, a voltage may be applied to the bottom electrode 125 and the top electrode 135 to cause the cantilever 115 to move up, move down, or vibrate. Thus, the actuators may provide feedback. Second, a mechanical force may be applied to the cantilever 115. The piezoelectric layer 130 converts that mechanical force to an electric charge, which shifts a threshold voltage of a thin-film transistor (TFT) so that the TFT detects the electric charge. Thus, the actuators may provide sensing responsive to force such as a user's touch. The functions and applications of a piezoelectric cantilever actuator such as the actuator 100 are described further in U.S. provisional patent application No. 62/185,506 titled "Integrated Piezoelectric Cantilever Actuator and Transistor for Touch Input and Haptic Feedback Applications" and filed Jun. 26, 2015 by Jesus Alfonso Caraveo Frescas, et al., which is incorporated herein by reference in its entirety.

Figure 1B:
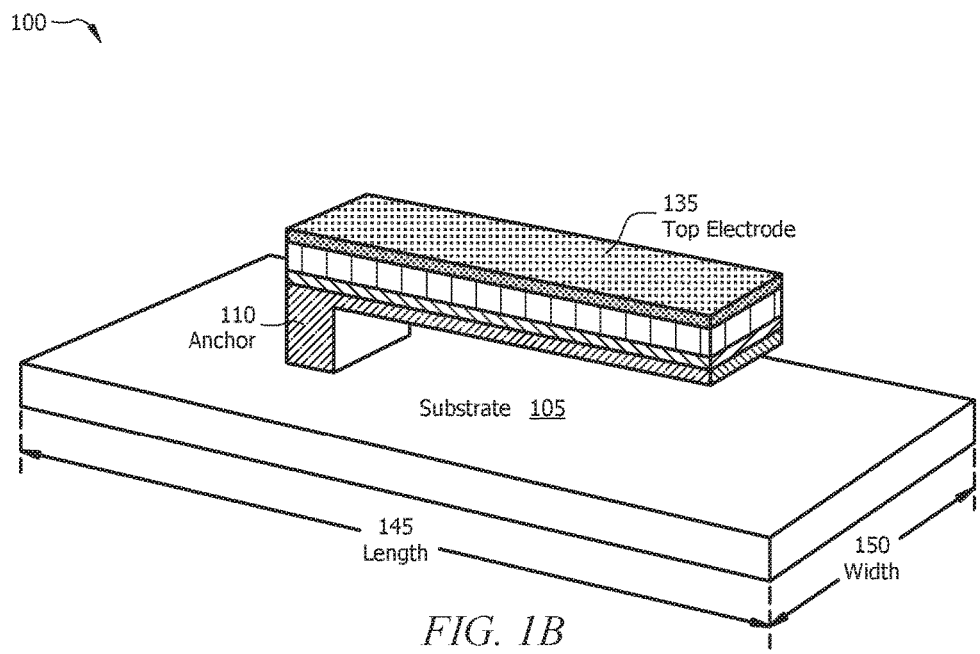
FIG. 1B is a perspective view of a schematic diagram of the piezoelectric cantilever actuator in FIG. 1A.

FIG. 1B is a perspective view of a schematic diagram of the piezoelectric cantilever actuator 100 in FIG. 1A. FIG. 1B highlights the substrate 105, the anchor 110, and the top electrode 135. In addition, FIG. 1B shows a length 145 and a width 150 of the actuator 100. As shown, the length 145 may be substantially longer than the width 150 in order to accommodate the shape of the cantilever 115.

Heretofore, at least three techniques may be used to fabricate the actuator 100. A first technique uses microfabrication processes. First, the anchor 110, the cantilever 115, and additional materials (e.g., electrode material, piezoelectric material, optional circuitry, and the like) are fabricated on the substrate 105 using photolithography deposition and patterning techniques such as physical vapor deposition, chemical vapor deposition, electroplating, wet etching, plasma dry etching, reactive ion etching, or another suitable process described below and in U.S. Pat. No. 7,253,488 titled "Piezo-TFT Cantilever MEMS" and filed Jan. 5, 2005 by Changqing Zhan, et al., which is incorporated by reference. The substrate 105 is a flat, continuous surface such as a silicon wafer. The materials are deposited and patterned with a suitable geometry that guarantees the integrity of the anchor 110 and the cantilever 115 at the end of fabrication. Second, the gap 140 is created by selective removal of the substrate 105

A photolithography technique patterns parts of a thin film or the bulk of the substrate 105 and uses light to transfer a geometric pattern from a photomask to a light-sensitive chemical photoresist on the substrate 105. A series of chemical treatments then either engraves the exposure pattern in, or enables deposition of a new material in the desired pattern on, the material underneath the photoresist exposure pattern. Physical vapor deposition uses vacuum deposition to deposit thin films by the condensation of a vaporized form of the desired film material onto various surfaces. Chemical vapor deposition is a chemical process that produces high-quality, high-performance solid materials. Electroplating uses electric current to reduce dissolved metal cations so that they form a coherent metal coating on an electrode. Wet etching chemically removes layers from the surface of the substrate 105. Plasma dry etching removes material by exposing the material to ions that dislodge portions of the material from the exposed surface. The ions may be a plasma of reactive gases such as fluorocarbons, oxygen, chlorine, boron tri-chloride, nitrogen, argon, helium, and other gases.

However, the etching step includes several sub-steps. In addition, it is difficult to selectively remove the substrate 105 only under the cantilever 115 without also removing the components of the cantilever 115, particularly because organic materials used for the piezoelectric layer 130 and other components of the cantilever 115 may have poor chemical resistance to etchants. Furthermore, the technique may require that the substrate 105 comprise rigid materials like silicon and glass. Moreover, the technique requires toxic etchants, sophisticated tools, and energy-intensive processes.

A second technique cuts and transfers the cantilever 115. First, the cantilever 115 and additional circuitry are fabricated on an initial substrate. Second, the cantilever 115 and additional circuitry are, or an array comprising multiple such cantilevers 115 and additional circuitries is, mechanically cut from the initial substrate. Third, the cantilever 115 and additional circuitry are transferred and glued to the anchor 110 on the substrate 105. The substrate 105 and the anchor 110 must comprise the appropriate geometry to properly match to the cantilever 115 and additional circuitry. This technique can include blade pressing and clamping, laser micromachining, punching, or another suitable process described below and in "Organic microcantilevers fabrication based on a technique adapted from flip chip for biosensing application" by L. Fadel-Taris, et al., which is incorporated by reference.

Blade pressing and clamping uses shearing, which cuts material without chipping, using burning, or using melting. Specifically, two sharp blades are joined together, and two additional sharp blades are joined perpendicular to the first two. The blade arrangement is then pressed on both the substrate 105 and the remaining components to form the cantilever 115. Laser micromachining uses a laser on the substrate 105 and the remaining components to pattern the cantilever 115. Punching uses shear forces to change the substrate 105 and the remaining components from a flat surface to a shaped surface and to therefore form the cantilever 115.

However, the separate fabrication of the substrate 105 and the cantilever 115 is a wasteful process, compromises accuracy, compromises the rigidity of the anchor 110, and is not suitable for micrometer-sized actuators like the actuator 100. For example, the substrate 105, the anchor 110, and the base layer 120 may be formed of different materials (each having different thermal and/or mechanical properties) and may be a non-integral, non-unitary, and discontinuous structure defined by one or more material and/or structural boundaries between the substrate 105, the anchor 110, and the base layer 120. The separate fabrication is necessary because fabrication techniques do not permit the substrate 105 to be mechanically flexible as required for the cantilever 115. In addition, the technique precludes actuators 100 with surface spread and provides low yield because the actuators 100 are damaged during the transferring and gluing steps. Furthermore, if the actuator 100 is combined with additional circuitry, the fabrication steps of the cantilever 115 have to be compatible with the fabrication steps of the whole actuator 100. Additional circuitry may include TFTs for sensing touch, force, pressure, vibration, and temperature. Fabricating the TFTs on a flexible substrate may require that the substrate 105 have a surface roughness below 20 nanometers (nm) and have no holes or defects in it, so the creation of the gap 140, and thus release of the cantilever 115, may have to be completed at the end of the fabrication. For those reasons, the second technique may require several different types of materials, thus making chemical compatibility a challenge. Moreover, the cutting and gluing process may compromise the integrity of the additional circuitry.

A third technique uses microinjection molding. First, the substrate 105 is formed to already comprise the shape of the cantilever 115. Second, the components of the cantilever 115 are injected into the cantilever 115. However, because the substrate 105 already comprises the shape of the cantilever 115 and is therefore a non-smooth, non-continuous (i.e., discontinuous), non-uniform surface, it is difficult to deposit and pattern components around that shape. Furthermore, the deposition of the additional circuitry requires a flat, continuous surface with no holes or other defects, which is not possible using this technique.

Disclosed herein are embodiments for improved fabrication of piezoelectric cantilever actuators. Specifically, the disclosed fabrication includes fabrication of both cantilevers and additional circuitry such as TFTs on the same substrate. Thus, there is no need for cutting the cantilevers from one substrate and transferring and gluing the cantilevers to another substrate. Patterning provides both anchors and gaps between the substrate and the cantilevers without compromising the integrity of the surfaces, including the top surfaces of the cantilevers on which the additional circuitry is fabricated. At the end of fabrication, recess areas around the cantilevers are cut in order to release the cantilevers. The recess areas may be cut in a u-shaped to form a free cantilever (e.g., having cuts along the two longitudinal sides of the cantilever arm and at the end opposite the base) capable of up or down movement. The fabrication uses physical processes that do not require chemical etchants, so the fabrication is compatible with organic piezoelectric materials. The fabrication is suitable for fabricating actuators at least in the micrometer (μm) to millimeter (mm) range. The integration of the actuators and the TFTs may provide for a haptic feedback system incorporating touch, force, pressure, vibration, and temperature sensing.

FIGS. 2A-7C show the disclosed fabrication in three primary steps. FIGS. 2A-3C show the first primary step of molding to form one or more cavities in the substrate, wherein the cavities correspond to one or more void spaces in a microelectronic device such as a piezoelectric cantilever actuator. FIGS. 4A-4I show the second primary step of electronics fabrication of the microelectronic device. FIGS. 5A-7C show the third primary step of releasing all or a portion of the microelectronic device (e.g., a cantilever) from the substrate.

Figure 2A:
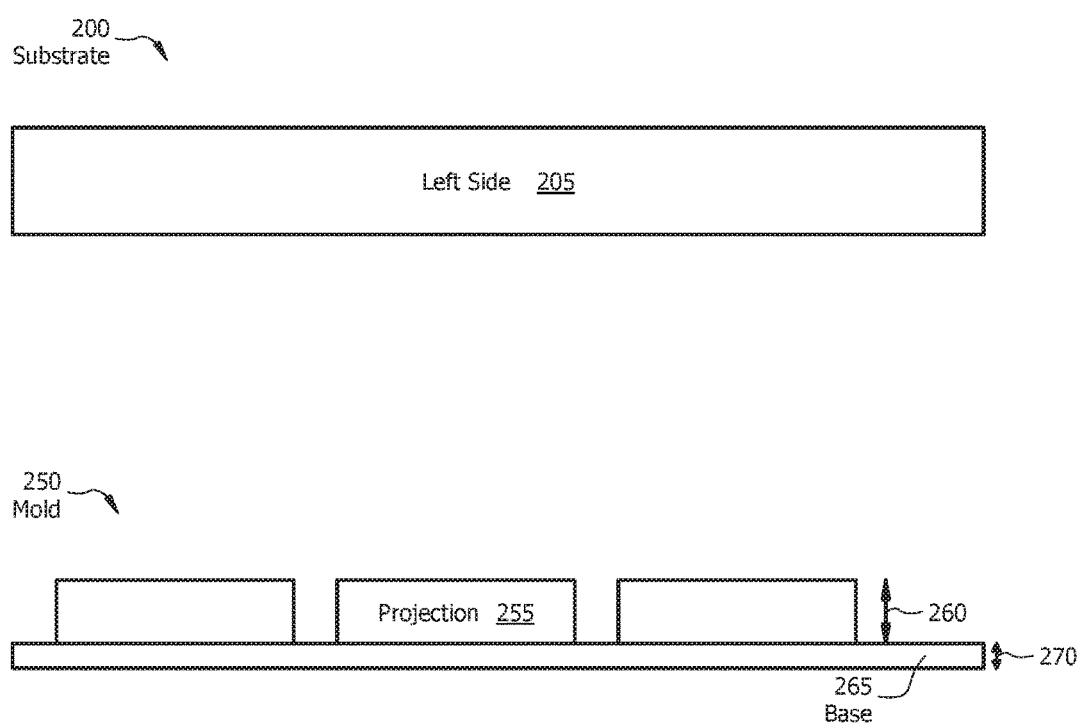
FIG. 2A is a side view of a substrate and a mold.

FIG. 2A is a side view of a substrate 200 and a mold 250. The substrate 200 comprises a left side 205 and a right side opposite the left side. The left side 205 is substantially uniform and flat. The right side is opposite from, parallel to, and similar to the left side 205. The substrate 200 further comprises thermoplastic or other suitable materials. Preferably, the substrate 200 is flexible to allow movement of cantilevers, which are described below; transparent for use as, for instance, a smartphone touchscreen; able to be plastically deformed to allow for cavities, which are described below; and able to maintain its structure after a desired point such as after molding or after completion of fabrication, which are described below. In an embodiment, the substrate comprises polycarbonate, poly(methyl methacrylate), or other transparent thermoplastics.

The mold 250 may also be referred to as a puncher or an imprinter. The mold 250 comprises one or more projections 255 and a base 265. The projections 255 may be any suitable size and shape corresponding the desired dimensions of a microelectronic device having one or more void spaces such as a piezoelectric cantilever actuator. For example the projections 255 are substantially rectangular and have heights 260 suitable for cantilevers to move up and down while maintaining structural integrity. In various embodiments, the height 260 of the projections is less than the thickness of the substrate 200, for example equal to or less than about 90, 80, 70, 60 or 50% of the thickness of the substrate. The base 265 has a height 270 suitable for supporting the cantilevers and additional circuitry, the latter of which is also described below. The size of the mold 250 may be any size suitable for accommodating a desired number of projections 255 and thus a desired number of cantilevers. The mold 250 further comprises metal or other suitable materials. For instance, the mold 250 may be stainless steel.

Figure 2B:
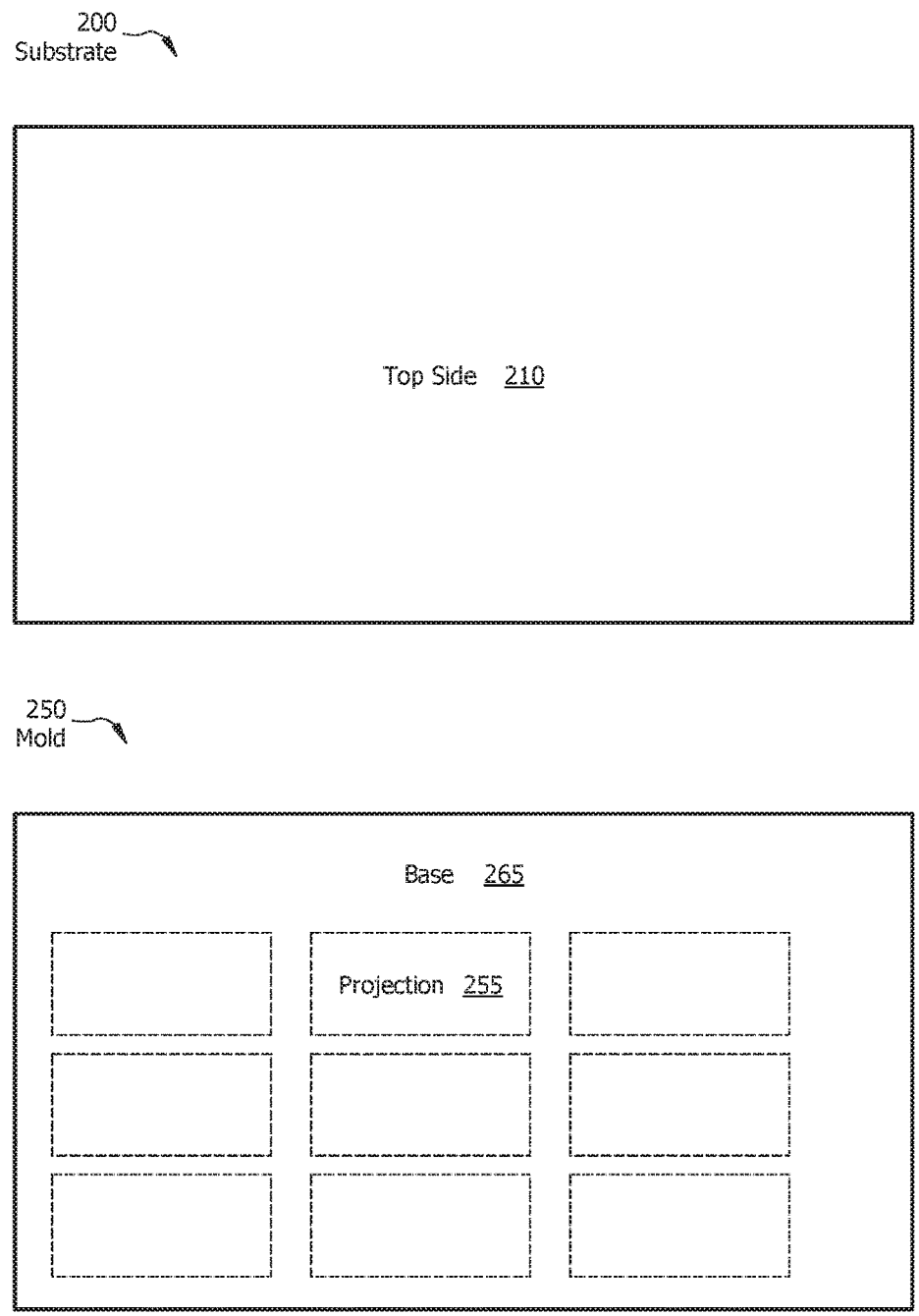
FIG. 2B is a top view of the substrate and the mold in FIG. 2A.

FIG. 2B is a top view of the substrate 200 and the mold 250 in FIG. 2A. The substrate 200 comprises a top side 210 and a bottom side opposite the top side. The top side 210 is substantially uniform, continuous, flat, and defect free in order to provide for fabrication of the additional circuitry. The bottom side is opposite from, parallel to, and similar to the top side 210. As shown, the substrate 200, the mold 250, and the projections 255 are substantially rectangular. Alternatively, the substrate 200, the mold 250, and the projections 255 are any other suitable shape.

Figure 2C:
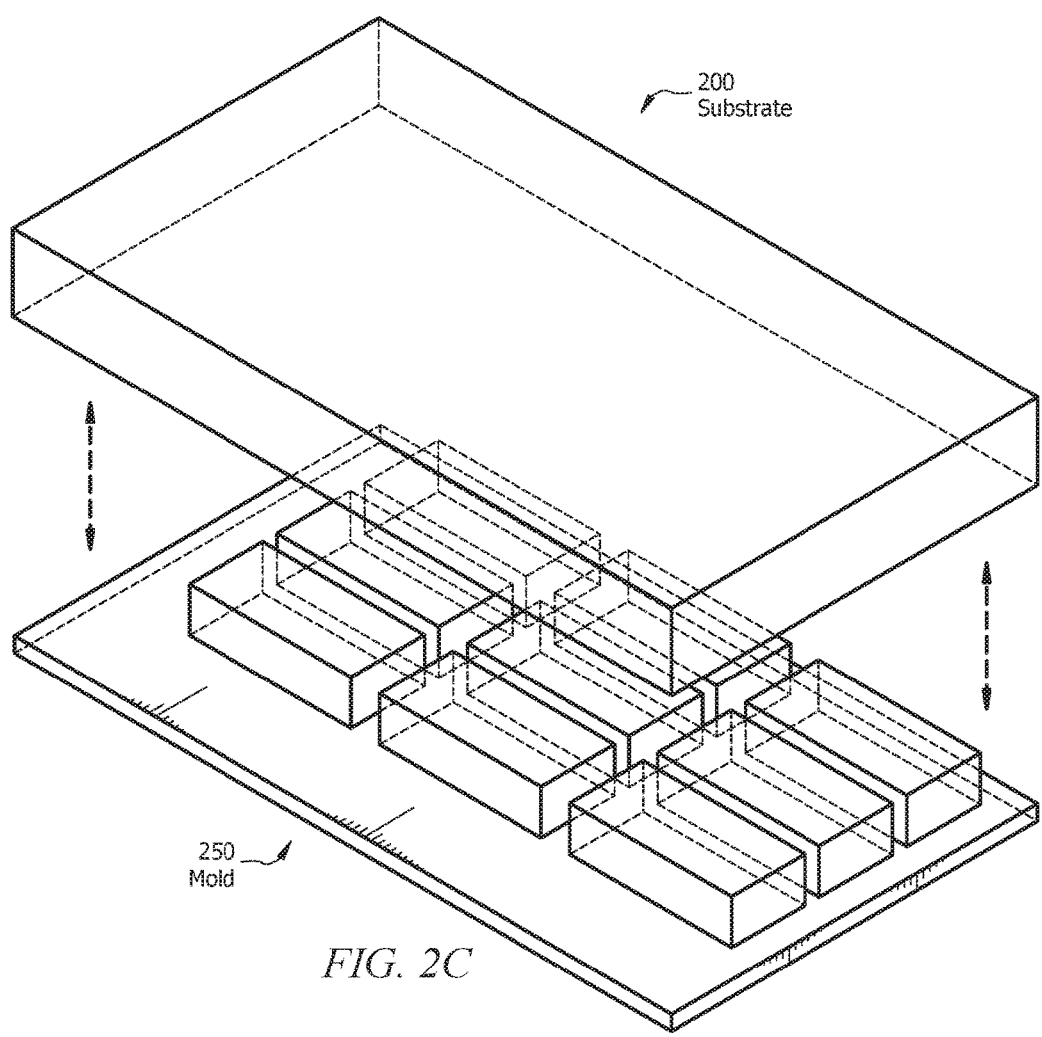
FIG. 2C is a perspective view of the substrate and the mold in FIGS. 2A and 2B.

FIG. 2C is a perspective view of the substrate 200 and the mold 250 in FIGS. 2A and 2B. As shown by the dashed double arrows, the mold 250 is punched into the substrate 200. In particular, the projections 255 of the mold 250 punch through the bottom of the substrate 200, which displaces portions of the substrate 200 to define and form the cavities, which are described below. The material from the displaced portions of the substrate 200 either moves to other portions of the substrate 200 to create relatively denser areas in those other portions or moves to other portions of the substrate 200 by forcing out yet other portions of the substrate 200, which may then be removed by cutting or another suitable process. For example, a solid, uniform press plate (e.g., metallic plate) may be applied to the top side 210 of the substrate concurrent with the punching via mold 250, and such would allow excess material to exit one or more side of the substrate external to the surfaces of the press plate and mold. Additionally, one or more side supports or forms (e.g., metallic rails) may be used in conjunction with the press plate to provide support, resistance, or define flow pathways for the sides of the substrate material during the punching. For example, a combination of a metallic press plate and metallic side rails may form a metallic housing corresponding in size and shape to the substrate which may be applied to the top and sides of the substrate while the substrate is being punched from the bottom surface. Alternatively, hot embossing or back substrate etching is used to form the cavities in the substrate. Because the molding step affects only the bottom of the substrate 200 while avoiding the use of etchants at the end of fabrication, the top side 210 of the substrate remains substantially uniform, continuous, flat, and defect free in order to provide for fabrication of the additional circuitry.

Optionally, after the molding in FIG. 2C, the substrate 200 may undergo a setting process. The setting process may comprise heating, ultraviolet exposure, cross-linking, or another suitable process. The setting process may ensure that the substrate 200 is able to maintain its structure after the molding (e.g., the cavities remain about constant in size and shape and the substrate material does not creep or otherwise return to its original, non-punched form).

Figure 3A:
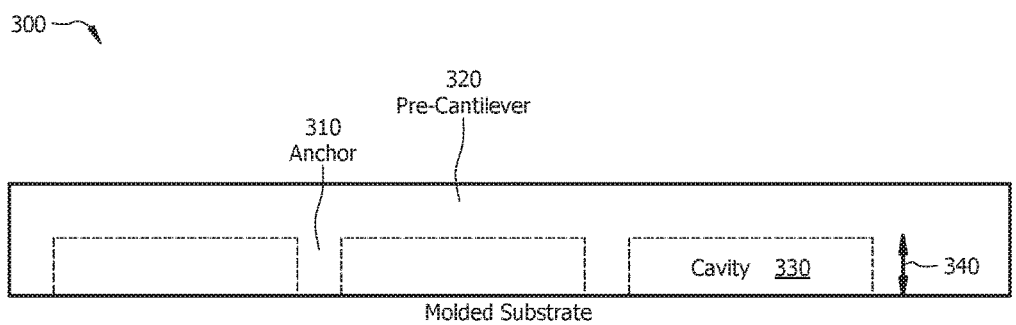
FIG. 3A is a side view of a molded substrate after the molding in FIG. 2C

FIG. 3A is a side view of a molded substrate 300 after the molding in FIG. 2C. The molded substrate 300 comprises anchors 310, pre-cantilevers 320, and cavities 330. The anchors 310 provide support for the cantilevers and provide gaps for the cantilevers to move up and down. The anchors 310 are similar to the anchors 110 in FIGS. 1A and 1B. The pre-cantilevers 320 become the cantilevers after further fabrication described below. The cavities 330 correspond to the displaced portions of the substrate 200 due to the projections 255 of the mold 250 as described above with respect to FIG. 2C. In particular, the cavities 330 have heights 340 corresponding to the heights 260 of the projections 255. The heights 340 are suitable for the cantilever to move up and down while maintaining structural integrity.

Figure 3B:
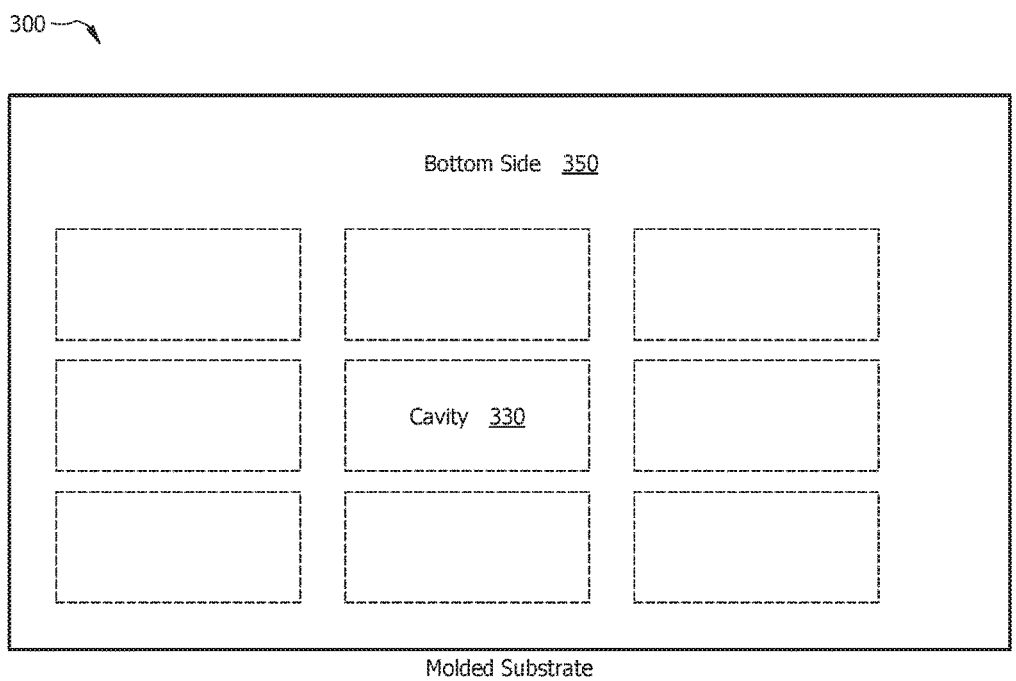
FIG. 3B is a transparent top view of the molded substrate in FIG. 3A.
Figure 3C:
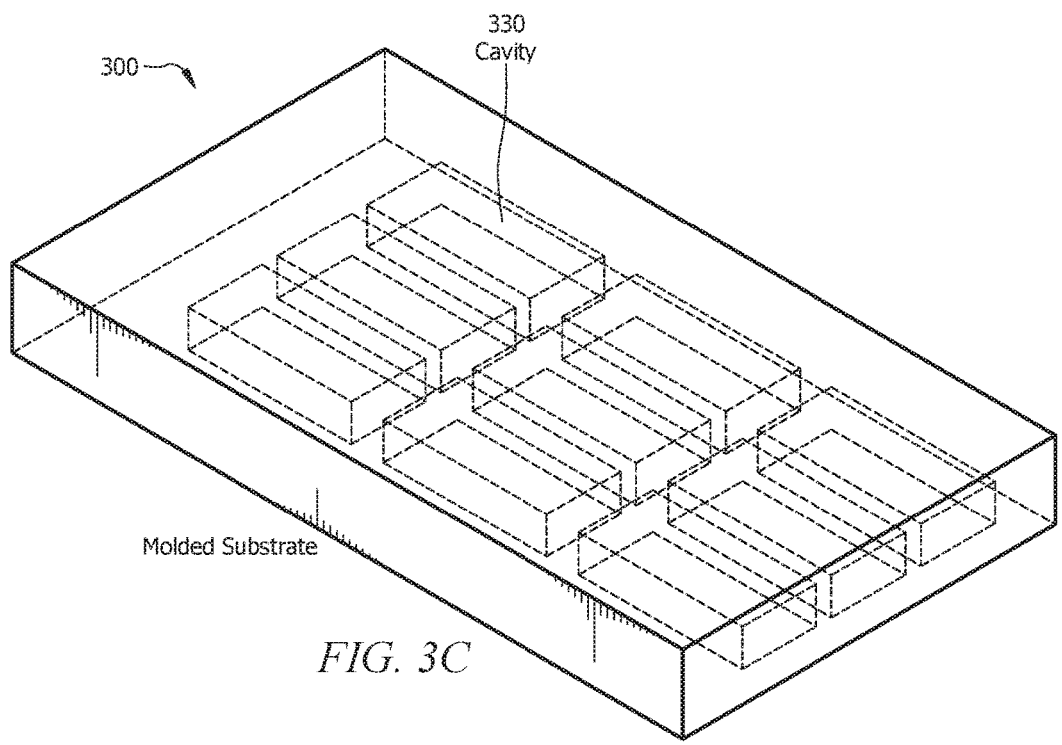
FIG. 3C is a transparent perspective view of the molded substrate in FIGS. 3A and 3B.

FIG. 3B is a bottom view of the molded substrate 300 in FIG. 3A. FIG. 3C is a transparent perspective view of the molded substrate 300 in FIGS. 3A and 3B. FIGS. 3B and 3C highlight bottom side 350 and the cavities 330 of the molded substrate 300. In particular, FIGS. 3B and 3C show nine cavities 330 in a 3×3 array. Any suitable number of cavities 330 in any suitable array design may be present in order to provide a desired number of cantilevers.

Following formation of the cavities 330, one or more additional layers of materials may be applied to the top surface 210 of the molded substrate 300 to form a desired microelectronic device, and such additional layers may be formed via conventional microelectronic fabrication techniques such as photolithography.

Figure 4A:
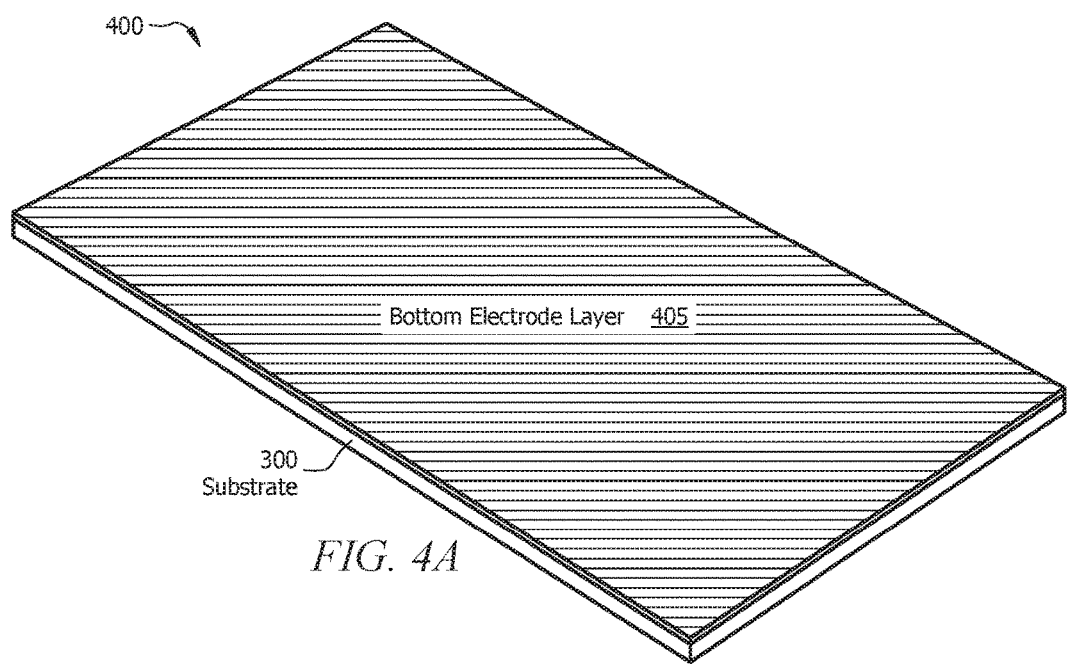
FIG. 4A is a perspective view of a substrate system.

FIG. 4A is a perspective view of a substrate system 400. The system 400 comprises the molded substrate 300 after deposition of a bottom electrode layer 405 on the top side 210 of the molded substrate 300. The bottom electrode layer 405 comprises a material suitable for electrical conductivity and serves as bottom electrodes for the cantilevers, gate contacts for TFTs, connectors, and contact pads, which are described below.

Figure 4B:
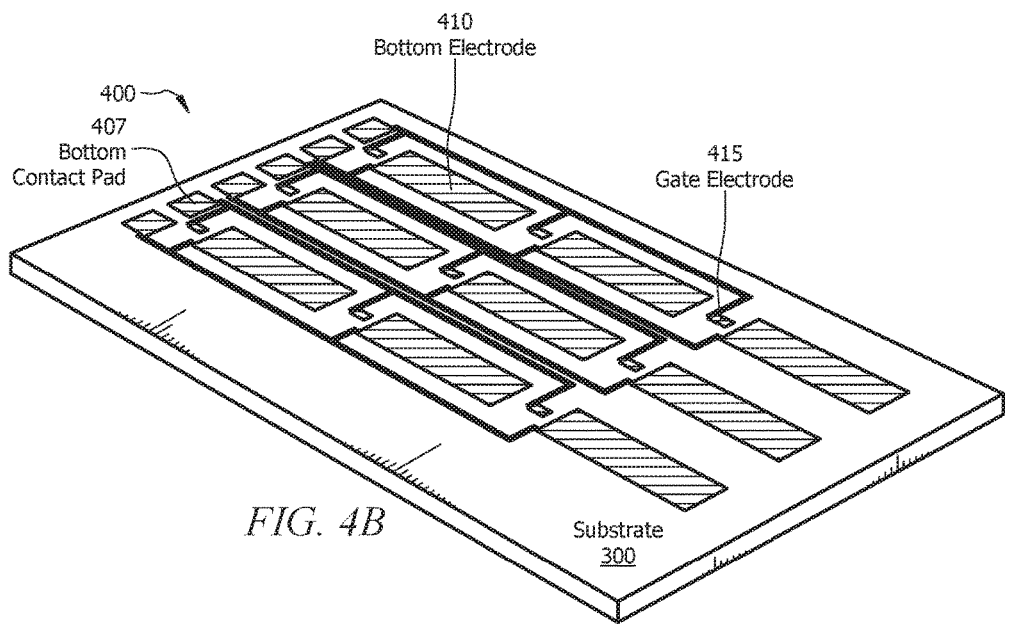
FIG. 4B is a perspective view of the substrate system in FIG. 4A after patterning of the bottom electrode layer.

FIG. 4B is a perspective view of the substrate system 400 in FIG. 4A after patterning of the bottom electrode layer 405. The patterning reveals bottom contact pads 407, bottom electrodes 410 for the cantilevers, and gate electrodes 415 for the TFTs. The bottom contact pads 407 provide electrical coupling to the bottom electrodes 410. The bottom electrodes 410 are similar to the bottom electrodes 125 in FIGS. 1A and 1B.

Figure 4C:
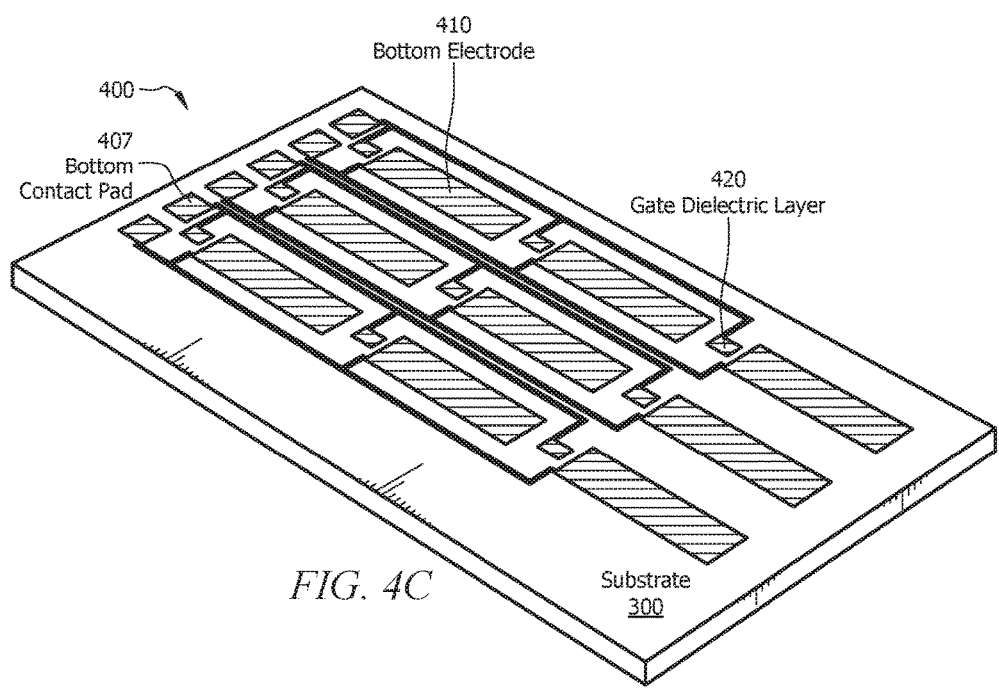
FIG. 4C is a perspective view of the substrate system in FIG. 4B after deposition and patterning of a dielectric layer.

FIG. 4C is a perspective view of the substrate system 400 in FIG. 4B after deposition and patterning of a dielectric layer. The dielectric layer comprises any suitable dielectric material. The patterning reveals gate dielectric layers 420 for the TFTs that are on top of the gate electrodes 415.

Figure 4D:
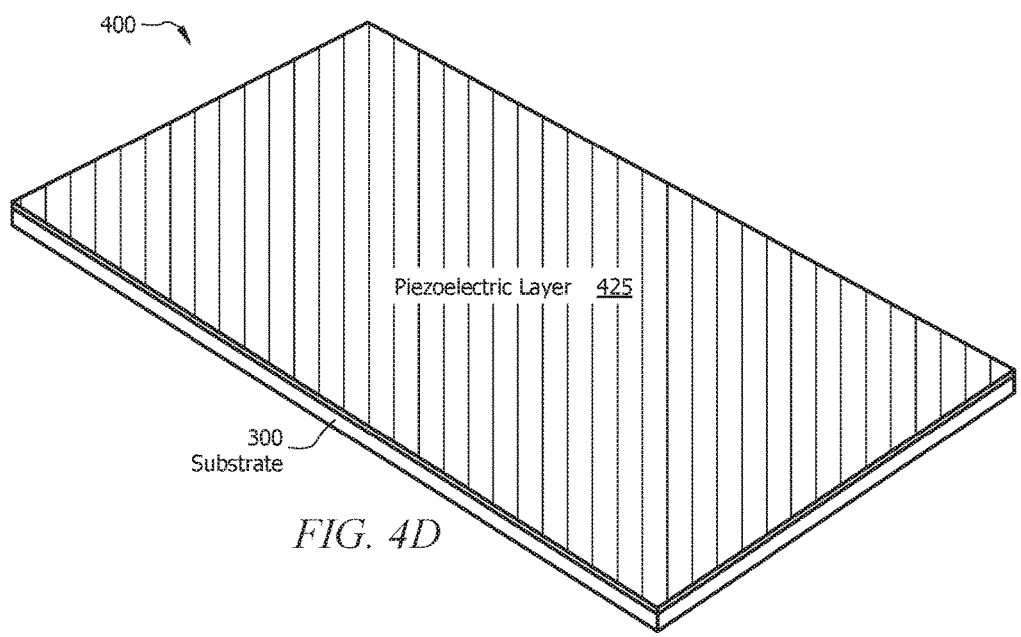
FIG. 4D is a perspective view of the substrate system in FIG. 4C after deposition of a piezoelectric layer on the top side of the substrate.

FIG. 4D is a perspective view of the substrate system 400 in FIG. 4C after deposition of a piezoelectric layer 425 on the top side 210 of the molded substrate 300. The piezoelectric layer 425 is also deposited on top of the bottom electrodes 410 and the gate dielectric layers 420. The piezoelectric layer 425 is similar to the piezoelectric layer 130 in FIGS. 1A and 1B. The piezoelectric layer 425 comprises any suitable organic piezoelectric material, provides active components for the cantilevers, and extends gate stacks for the TFTs. The piezoelectric layer 425 may also function as a dielectric layer. Thus, the dielectric layer described with respect to FIG. 4C, which results in the gate dielectric layers 420, may be omitted.

Figure 4E:
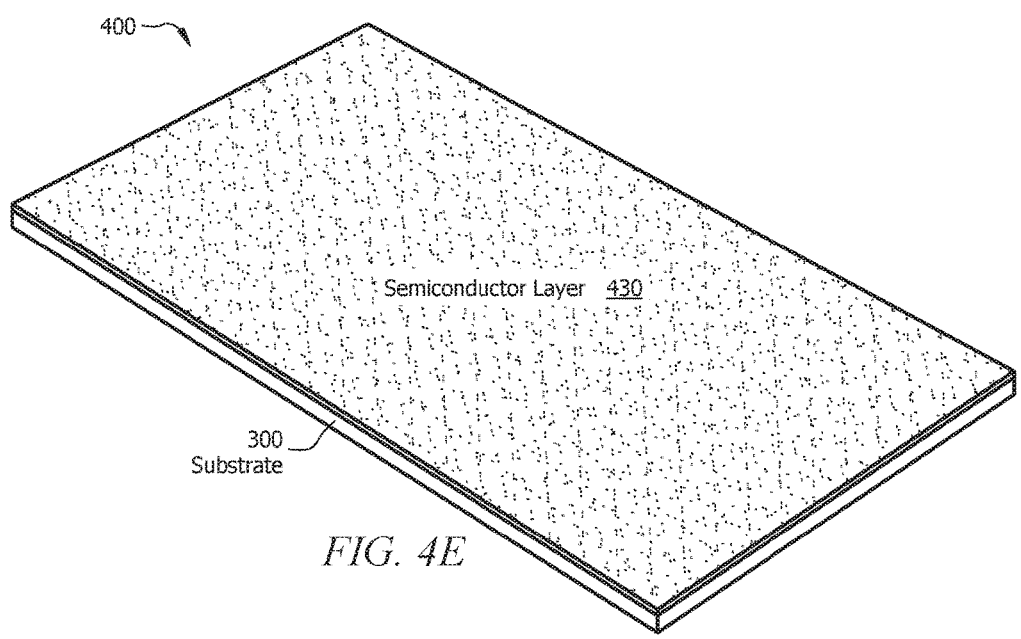
FIG. 4E is a perspective view of the substrate system in FIG. 4D after deposition of a semiconductor layer on top of the piezoelectric layer.

FIG. 4E is a perspective view of the substrate system 400 in FIG. 4D after deposition of a semiconductor layer 430 on top of the piezoelectric layer 425. The semiconductor layer 430 comprises any suitable semiconductor material such as silicon (Si), germanium (Ge), gallium arsenide (GaAs), zinc oxide (ZnO), indium- and gallium-doped zinc oxide (IGZO), or amorphous silicon (a-Si). The semiconductor layer 430 provides the active layers of the TFTs.

Figure 4F:
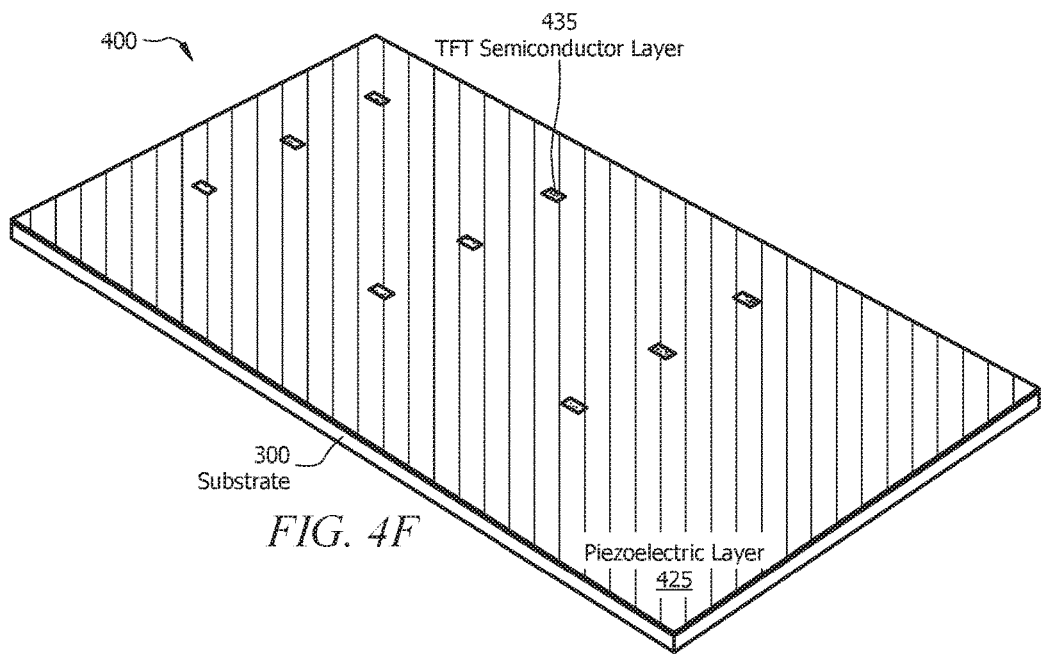
FIG. 4F is a perspective view of the substrate system in FIG. 4E after patterning of the semiconductor layer.

FIG. 4F is a perspective view of the substrate system 400 in FIG. 4E after patterning of the semiconductor layer 430. The patterning removes the semiconductor layer 430, except for on top of the piezoelectric layer 425 residing on top of the gate dielectric layers 420, to reveal TFT semiconductor layers 435. The piezoelectric layer 425 remains on top of the rest of the system 400.

Figure 4G:
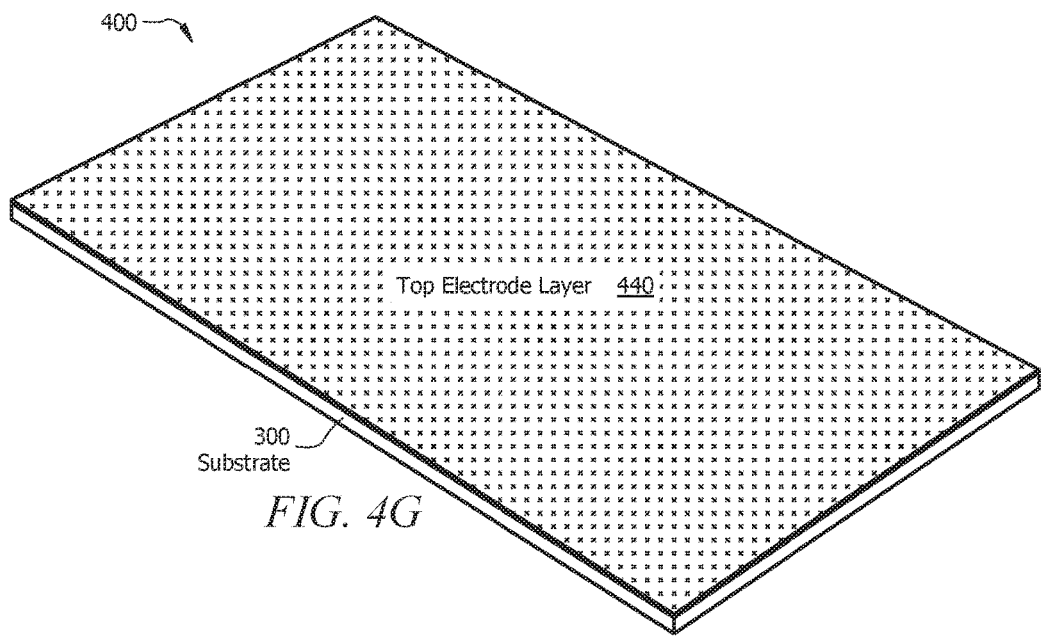
FIG. 4G is a perspective view of the substrate system in FIG. 4F after deposition of a top electrode layer on top of the piezoelectric layer and the TFT semiconductor layers.

FIG. 4G is a perspective view of the substrate system 400 in FIG. 4F after deposition of a top electrode layer 440 on top of the piezoelectric layer 425 and the TFT semiconductor layers 435. The top electrode layer 440 comprises a material suitable for electrical conductivity.

Figure 4H:
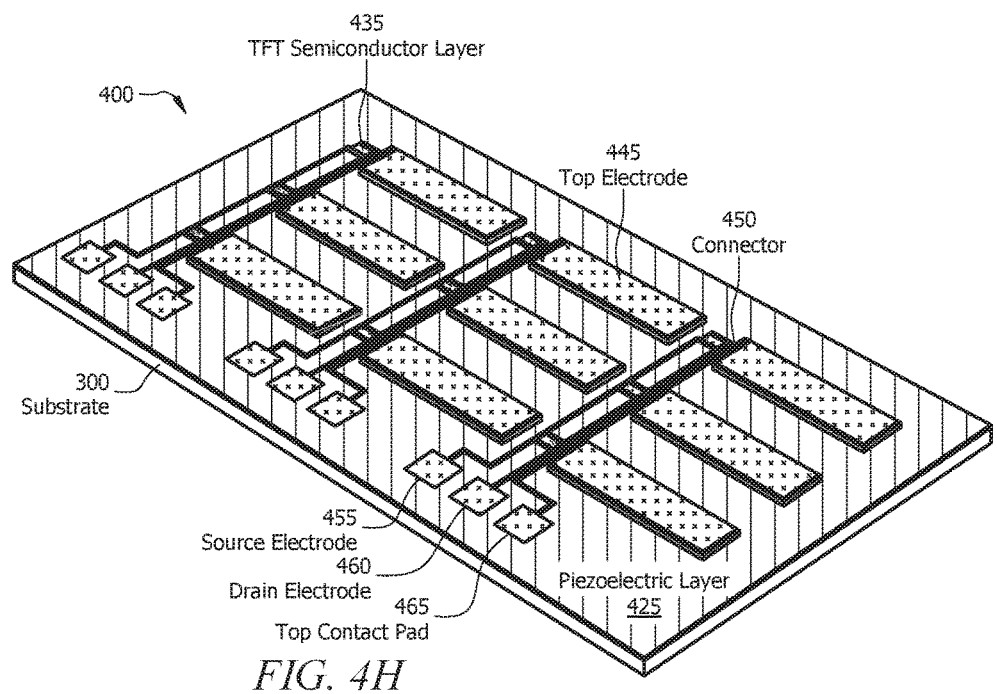
FIG. 4H is a perspective view of the substrate system in FIG. 4G after patterning of the top electrode layer.

FIG. 4H is a perspective view of the substrate system 400 in FIG. 4G after patterning of the top electrode layer 440. The patterning reveals the TFT semiconductor layers 435, top electrodes 445 for the cantilevers, connectors 450, source electrodes 455 for the TFTs, drain electrodes 460 for the TFTs, and top contact pads 465. The top electrodes 445 are similar to the top electrodes 135 in FIGS. 1A and 1B. The top contact pads 465 provide electrical coupling to the top electrodes 445.

The steps above describe TFTs with gate electrodes 415 in a bottom configuration. Specifically, above the gate electrodes 415 are, in order, the gate dielectric layers 420, the piezoelectric layer 425, and the TFT semiconductor layers 435. Alternatively, the TFTs have gate electrodes 415 in a top configuration. Specifically, the source electrodes 455 and the drain electrodes 460 are formed along with the bottom electrodes 410. Above the bottom electrodes 410 are, in order, the semiconductor layers 435, the gate dielectric layers 420, the piezoelectric layer 425, and the gate electrodes 415. The gate electrodes 415 are patterned at the same time as the top electrodes 445.

Figure 4I:
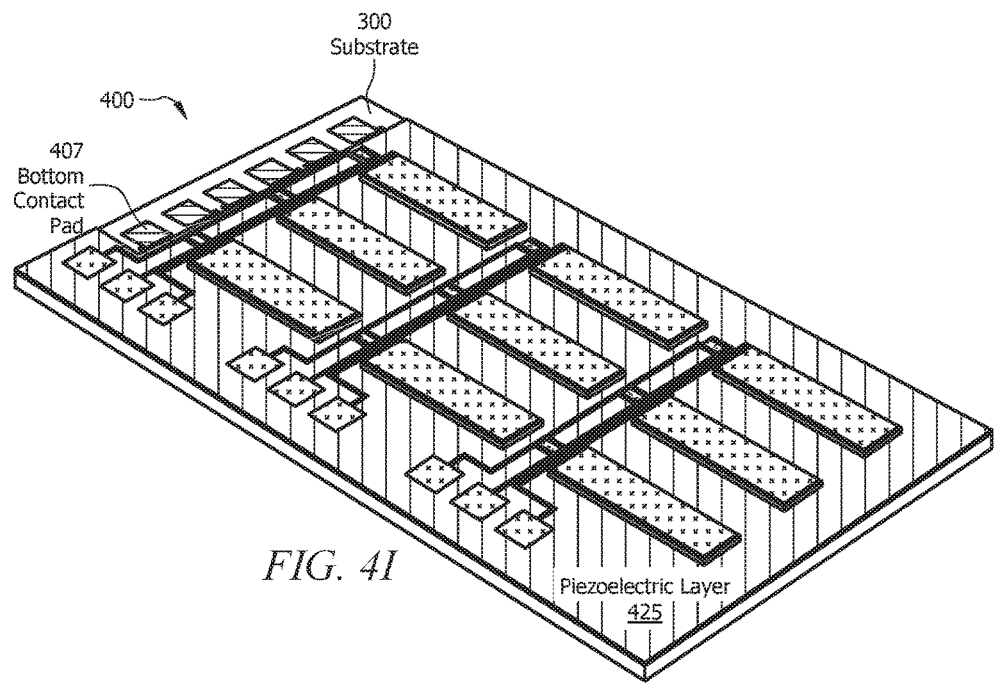
FIG. 4I is a perspective view of the substrate system in FIG. 4H after etching or removal of the piezoelectric layer.

FIG. 4I is a perspective view of the substrate system 400 in FIG. 4H after etching or removal of the piezoelectric layer 425. The etching or removal reveals the bottom contact pads 407, which provide access to the bottom electrodes 410 through electrical coupling. The etching or removal also reveals the molded substrate 300 around the bottom contact pads 407.

The above sub-steps described with respect to FIGS. 4A-4I use any suitable photolithographic methods to perform deposition and patterning. As shown, layers are first deposited. The layers are then then patterned by selective removal. Alternatively, the layers are selectively deposited without further patterning. Combinations of those processes may also be used. In addition, the above sub-steps demonstrate deposition and patterning of TFTs. Any suitable additional circuitry may be deposited and patterned in a similar manner to yield any desired microelectronic device having one or more cavities or void spaces therein.

Figure 5A:
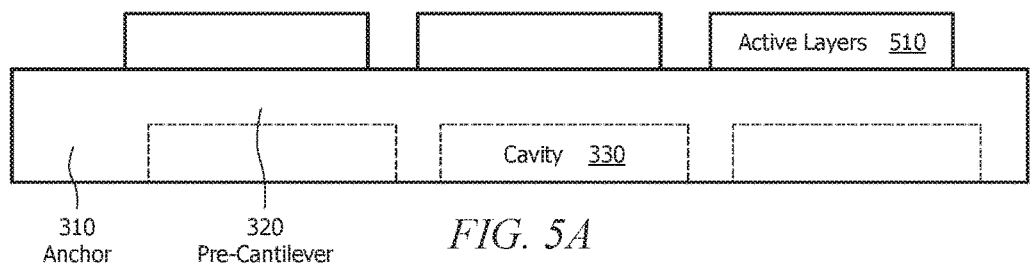
FIG. 5A is a side view of the substrate system in FIG. 4I.

FIG. 5A is a side view of the substrate system 400 in FIG. 4I. FIG. 5A highlights the anchors 310, the pre-cantilevers 320, the cavities 330, and active layers 510. The active layers 510 comprise the bottom electrodes 410, the piezoelectric layer 425, and the top electrodes 445. The active layers 510 sit on top of their respective pre-cantilevers 320.

Figure 5B:
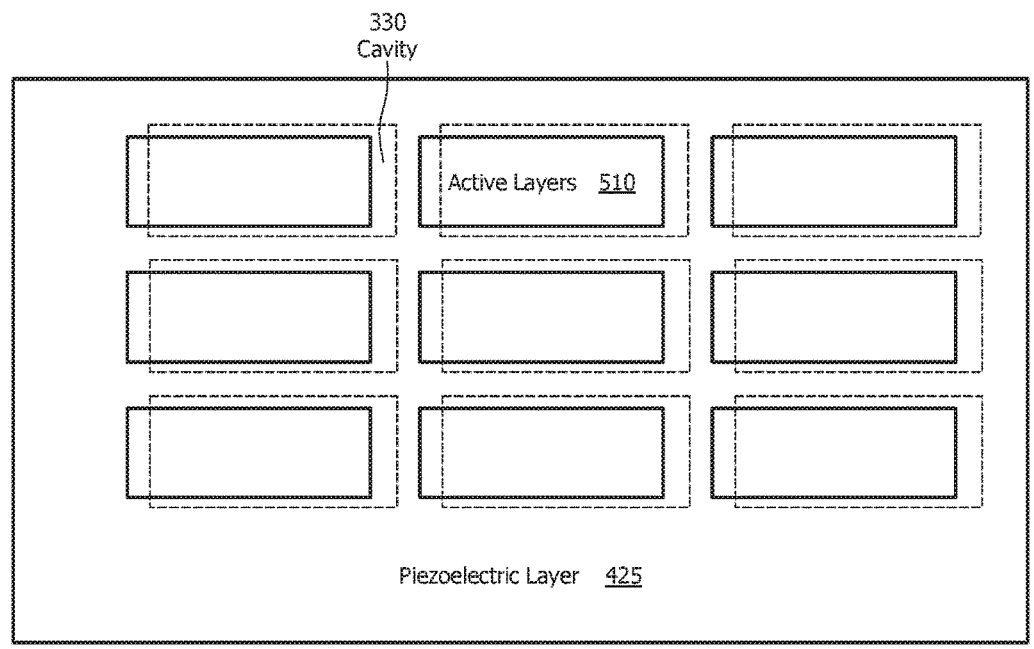
FIG. 5B is a transparent top view of the substrate system in FIG. 5A.

FIG. 5B is a transparent top view of the substrate system 400 in FIG. 5A. FIG. 5B highlights the cavities 330, the piezoelectric layer 425, and the active layers 510. As shown, the cavities 330 provide open areas above, below, and to the side of the pre-cantilevers 320, that is the dimensions of the cavities 330 are greater than those of the pre-cantilevers 320, thereby providing space for cutting as described herein to form the free cantilevers.

Figure 5C:
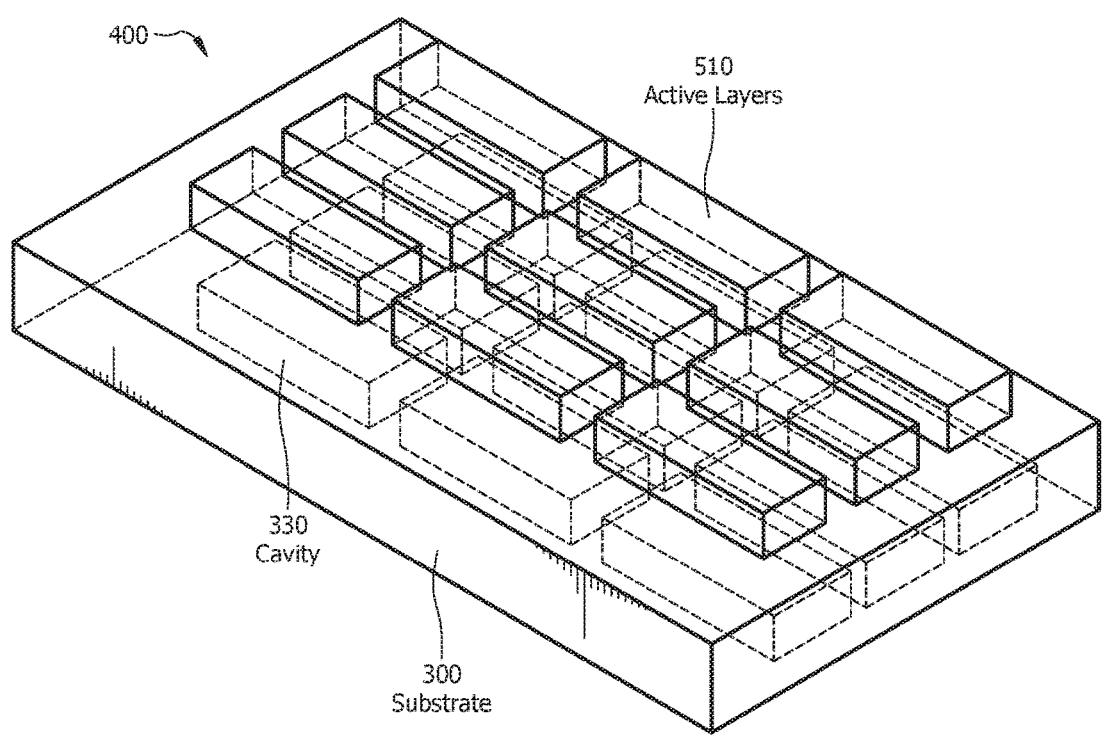
FIG. 5C is a transparent perspective view of the substrate system in FIGS. 5A and 5B.

FIG. 5C is a transparent perspective view of the substrate system 400 in FIGS. 5A and 5B. FIG. 5C highlights the molded substrate 300, the cavities 330, and the active layers 510.

Figure 6A:
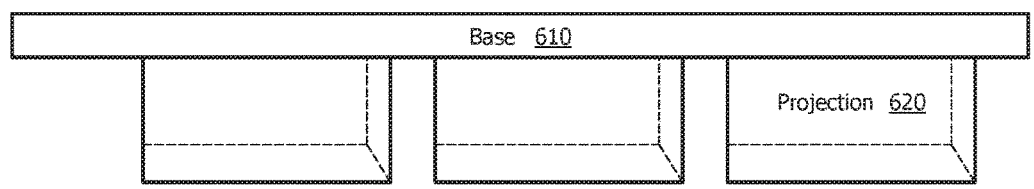
FIG. 6A is a side view of a cutter and the substrate system in FIGS. 5A-5C.
Figure 6A:
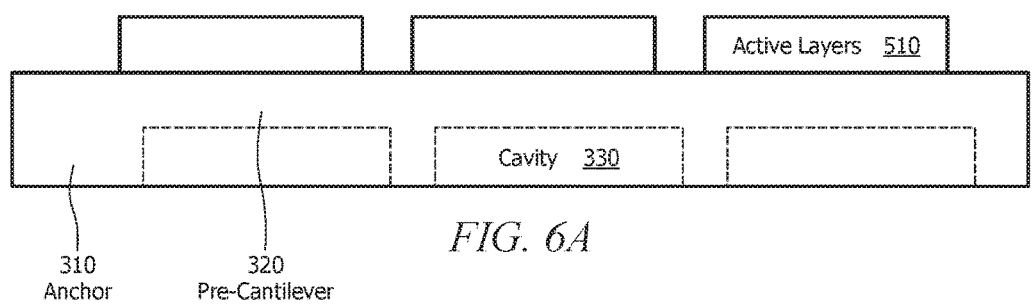

FIG. 6A is a side view of a cutter 600 and the substrate system 400 in FIGS. 5A-5C. The anchors 310, the pre-cantilevers 320, the cavities 330, and the active layers 510 are shown in the system 400. The cutter 600 may also be referred to as a stamp. The cutter 600 comprises a base 610 and projections 620. The base 610 has a rigidity suitable for supporting the projections 620 and a stamping process. The projections 620 comprise sharp edges suitable for the stamping process. The cutter 600 further comprises metal or other suitable materials. For instance, the cutter 600 may be stainless steel. The cutter 600 may be substantially the same shape and size of the system 400.

Figure 6B:
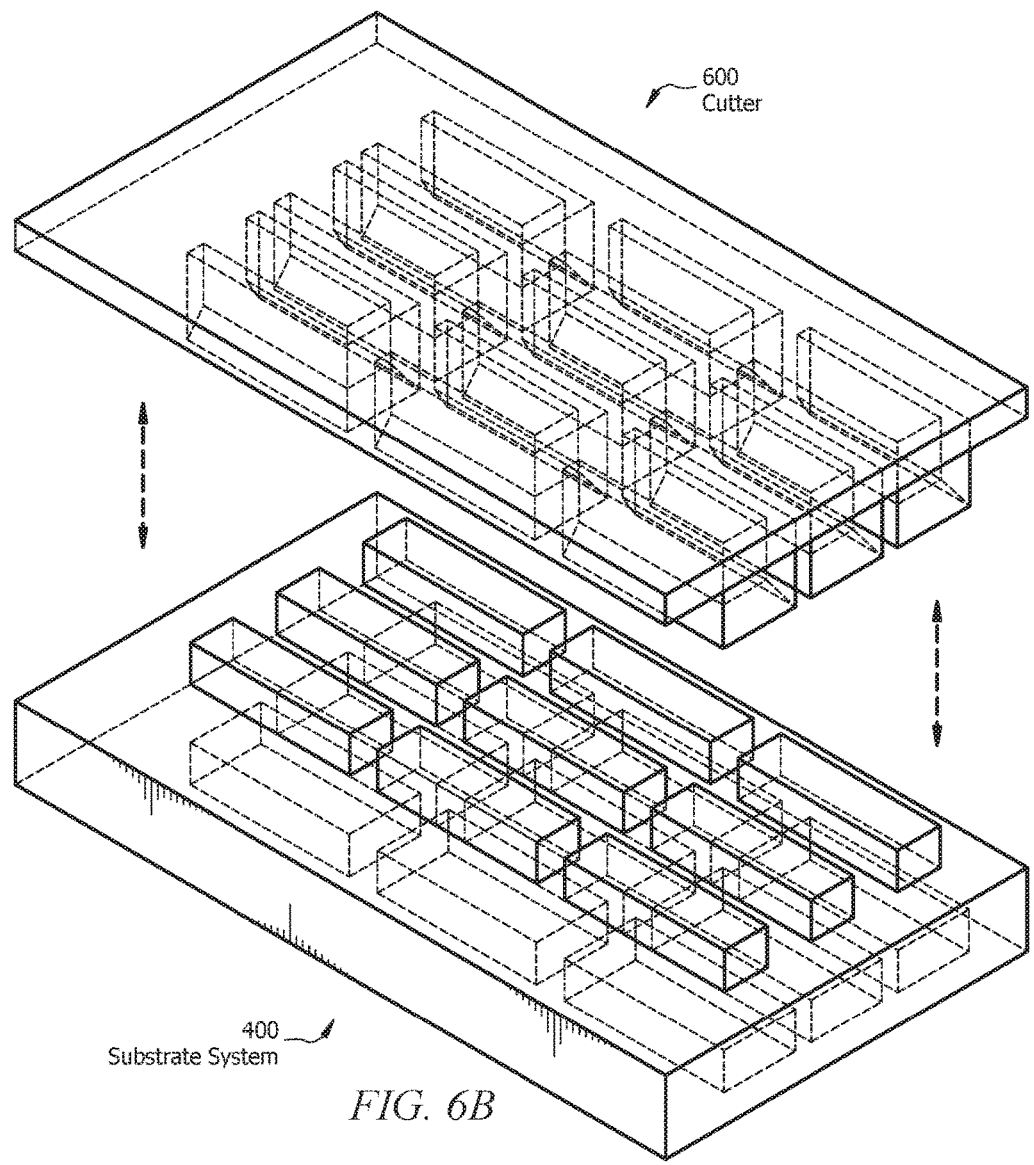
FIG. 6B is a transparent top view of the cutter and the substrate system in FIG. 6A.
Figure 6C:
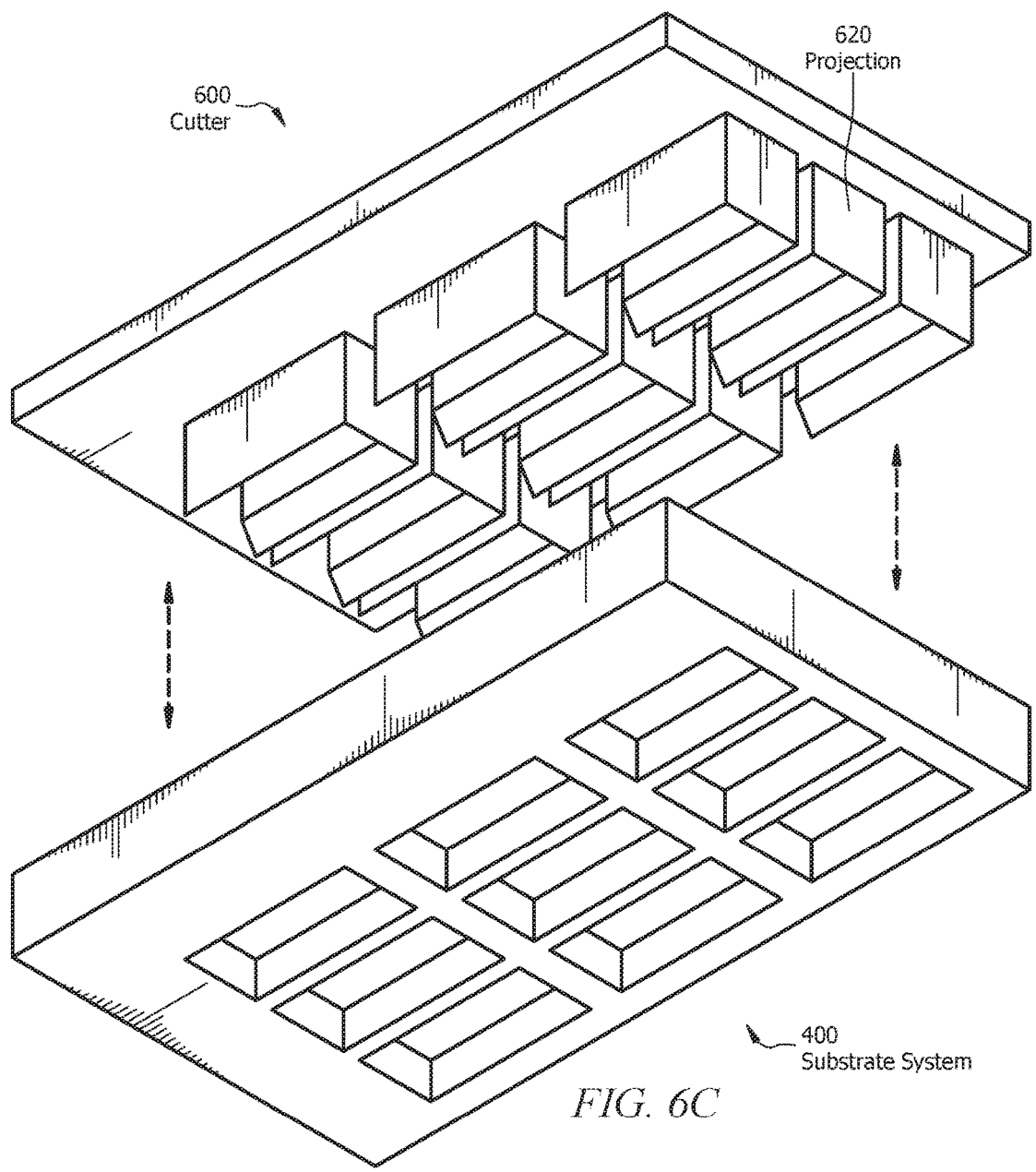
FIG. 6C is a transparent bottom view of the cutter and the substrate system in FIGS. 6A and 6B.

FIG. 6B is a transparent top view of the cutter 600 and the substrate system 400 in FIG. 6A. FIG. 6C is a transparent bottom view of the cutter 600 and the substrate system 400 in FIGS. 6A and 6B. As shown in FIG. 6C, the projections 620 of the cutter 600 are u-shaped in order to define u-shaped recess areas, which are described below. The u-shape of the projections 620 have a pair of longitudinal cutting surfaces (e.g., blades) running parallel to the sides of the cantilever arm and an end cutting surface (e.g., blade) running parallel to the end of the cantilever arm opposite the anchor. The u-shaped projections 620 are sized and shaped complimentary to the projections 255 of the punch such that the u-shaped projections extend into the cavities 330 of the molded substrate in a male-female cooperative arrangement. Alternatively, the projections 620 and the recess areas are any other suitable shape. As shown by the dashed double arrows in both FIGS. 6B and 6C, the cutter 600 is stamped onto the system 400. In particular, the projections 620 cut through the top of the system 400. During cutting, material may be severed or otherwise displaced over portions of the system 400, for example by pushing those portions (e.g., cuttings or trimmings) through the bottom of the system 400.

Figure 7A:
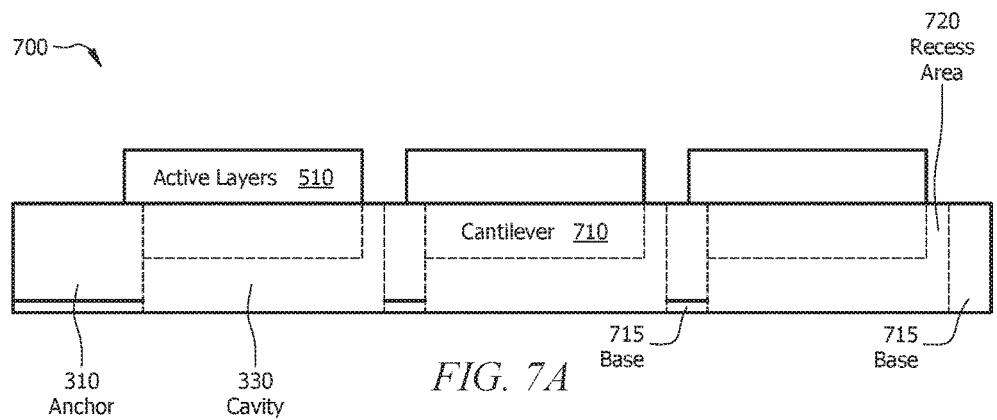
FIG. 7A is a side view of a schematic diagram of a stamped substrate system after the stamping in FIGS. 6B and 6C.

FIG. 7A is a side view of a schematic diagram of a stamped substrate system 700 after the stamping in FIGS. 6B and 6C. The system 700 comprises the anchors 310, the cavities 330, and the active layers 510. In addition, as a result of the stamping, the system 700 comprises cantilevers 710 and recess areas 720. The cantilevers 710 and the recess areas 720 are formed from the cutter 600 cutting around the pre-cantilevers 320. Specifically, the cutter 600 cuts the pre-cantilevers 320 apart from each other laterally across the page and cuts the pre-cantilevers 320 from the molded substrate 300 laterally into and out of the page, thus releasing the pre-cantilevers 320 from each other and the molded substrate 300 and thus forming the cantilevers 710 and the recess areas 720. Bottom surfaces of the cantilevers 710 substantially define the cavities 330, and front, left side, and right side surfaces of the cantilevers 710 substantially define the recess areas 720. The active layers 510 partially sit on top of their respective anchors 310 and substantially sit on top of their respective cantilevers 710.

Though the anchors 310 and the cantilevers 710 are shown as separate components, they are part of the same original substrate 200. In addition, the anchors 310 are attached to a base 715 of the substrate 200. Thus, the above techniques allow for the base 715, the anchors 310, and the cantilevers 710 to be formed from a single substrate.

Figure 7B:
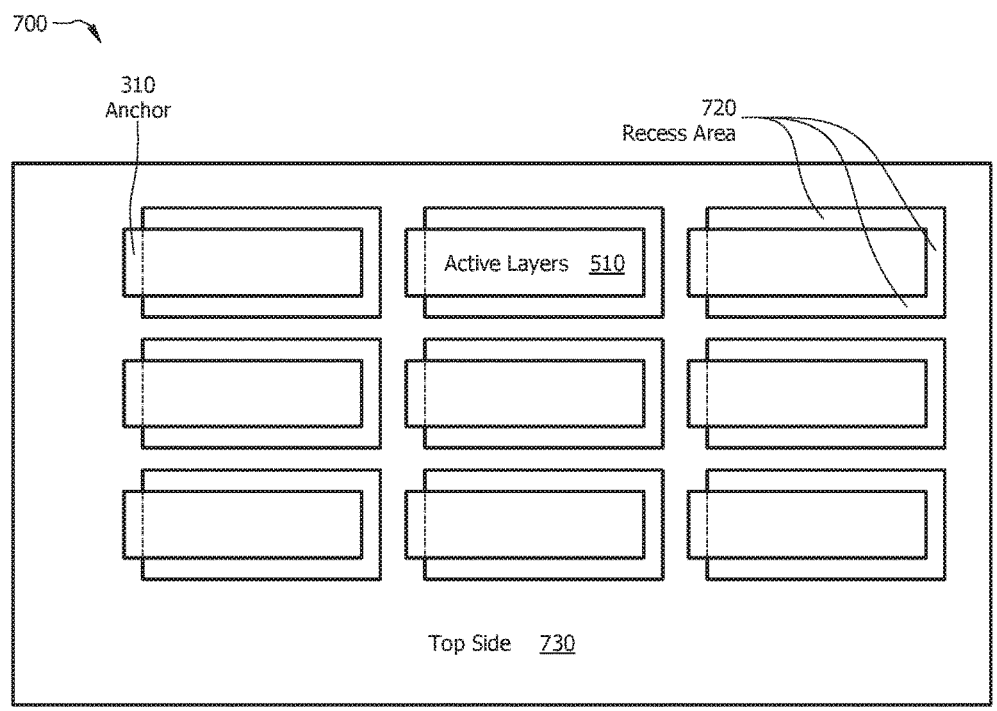
FIG. 7B is a top view of a schematic diagram of the stamped substrate system in FIG. 7A.

FIG. 7B is a top view of a schematic diagram of the stamped substrate system 700 in FIG. 7A. FIG. 7B highlights the recess areas 720. Specifically, the recess areas 720 comprise portions above, below, and to the right of the active layers 510 and thus the cantilevers 710.

Figure 7C:
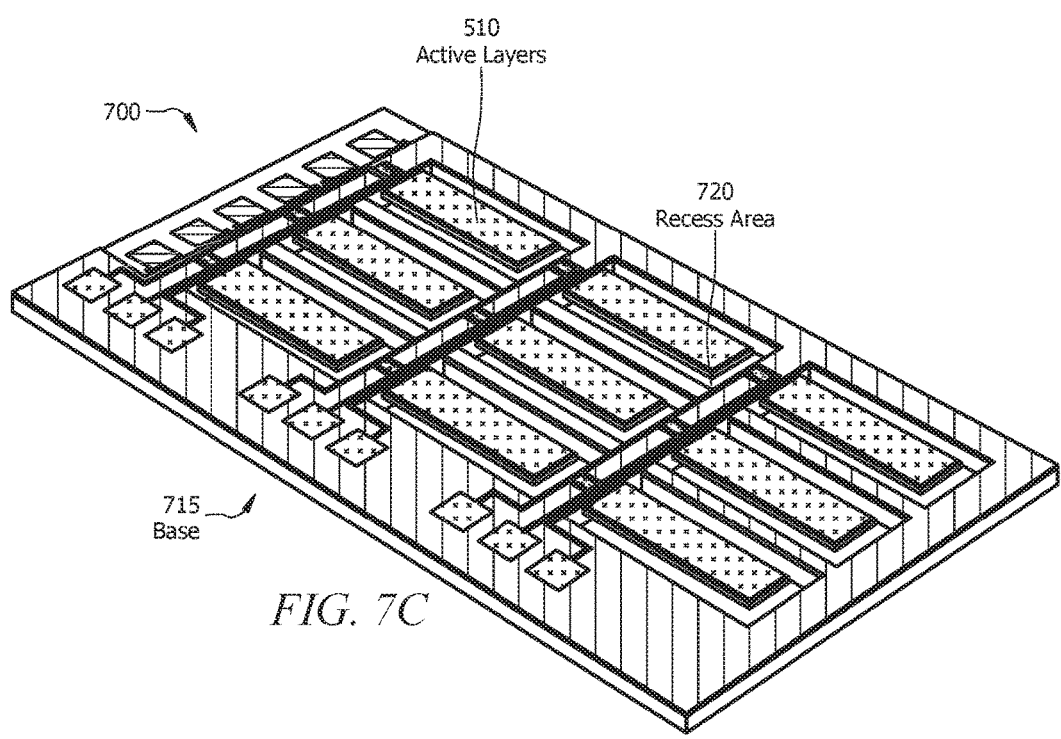
FIG. 7C is a perspective view of a schematic diagram of the stamped substrate system in FIGS. 7A and 7B.

FIG. 7C is a perspective view of a schematic diagram of the stamped substrate system 700 in FIGS. 7A and 7B. FIG. 7C highlights the recess areas 720, which provide u-shapes around the active layers 510, which are on top of the cantilevers 710. FIG. 7C also highlights the cavities 330 underneath the cantilevers 710.

The cantilevers 710 are shown in a 3×3 array. Any desired array may be chosen in advance. For instance, each cantilever 710 may correspond to an alpha-numeric key on a smartphone touchscreen. Alternatively, a larger array may first be fabricated, then the cantilevers 710 may be cut apart into individual cantilevers 710 or a smaller array. The cantilevers 710 may be in the micrometer to millimeter range. For instance, the cantilevers 710 may be about 500 µm long, about 1 mm long, or about 5 mm long. The disclosed technique may provide for shorter lengths as well.

The cantilevers 710 and the active layers 510 together form piezoelectric cantilever actuators. The actuators may perform two functions. First, a voltage may be applied to the bottom electrodes 410 and the top electrodes 445 to cause the cantilevers 710 to move up, move down, or vibrate. Thus, the actuators may provide feedback such as haptic feedback on a touchscreen on a computing device such as a laptop, tablet, mobile phone, etc. (e.g., providing a user with a sense of physically touching digitally displaced keys on a touchscreen). Second, mechanical forces may be applied to the cantilevers 710. The piezoelectric layer 425 converts those mechanical forces to electric charges, which shift threshold voltages of the TFTs so that the TFTs detect the electric charges. Thus, the actuators may provide sensing to user input via touch (e.g., a touchscreen on a computing device such as a laptop, tablet, mobile phone, etc.).

Figure 8:
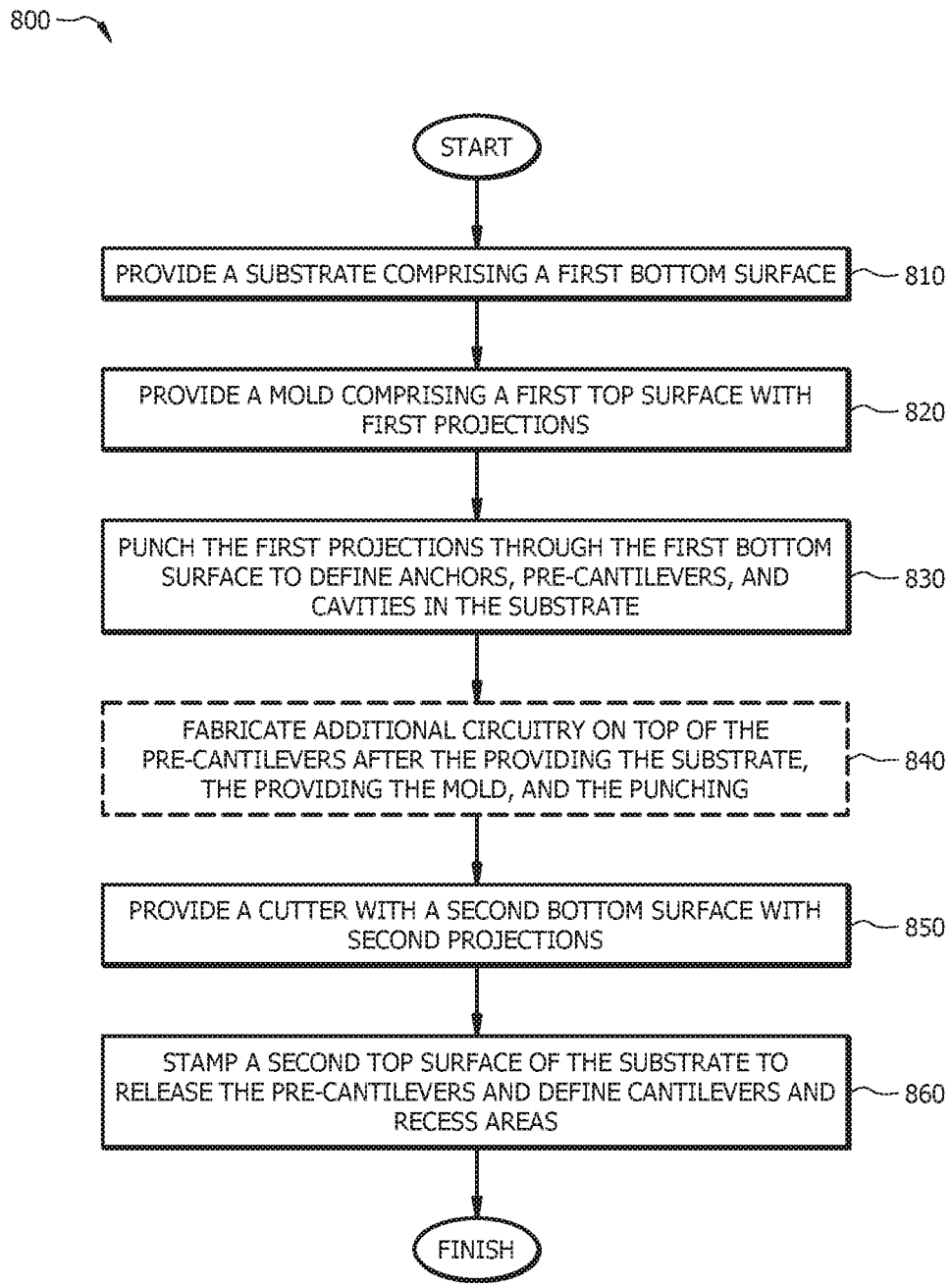
FIG. 8 is a flowchart of a method for fabricating a system.

FIG. 8 is a flowchart of a method 800 for fabricating a system. At step 810, a substrate comprising a first bottom surface is provided. For instance, the substrate is the substrate 200. At step 820, a mold comprising a first top surface with first projections is provided. For instance, the mold is the mold 250 comprising the projections 255. At step 830, the projections are punched through the first bottom surface to define anchors, pre-cantilevers, and cavities in the substrate. For instance, the anchors are the anchors 310, the pre-cantilevers are the pre-cantilevers 320, and the cavities are the cavities 330.

Step 840 is optional so that the method 800 may proceed to step 850 without performing step 840. At step 840, additional circuitry is fabricated on top of the pre-cantilevers after the providing the substrate, the providing the mold, and the punching. For instance, the additional circuitry, including the TFTs described in FIGS. 4A-5C, is fabricated on top of the pre-cantilevers 320 after steps 810-830. The TFTs may comprise the bottom electrode layer 405, the gate dielectric layer 420, the piezoelectric layer 425, the TFT semiconductor layers 435, and the top electrode layer 440. In one or more alternative embodiments, the substrate may be modified to contain additional material, circuitry, or the like prior to steps 810-830, that is a pre-modified substrate may be molded and cavities formed therein, and the method may resume at optional step 840 to provide further additional material and/or circuitry.

At step 850, a cutter with a second bottom surface with second projections is provided. For instance, the cutter is the cutter 600 comprising the projections 620. Finally, at step 860, a second top surface of the substrate is stamped to release the pre-cantilevers and define cantilevers and recess areas. For instance, the substrate is the substrate system 400, the pre-cantilevers are the pre-cantilevers 320, the cantilevers are the cantilevers 710, and the recess areas are the recess areas 720. In one or more alternative embodiments, the substrate may be modified to contain additional material, circuitry, or the like subsequent to steps 810-860, that is a molded, cut substrate (thereby defining one or more cavities or void spaces in a microelectronic device) may be further modified via additional microelectronics fabrication techniques (for example, incorporated into a display touchscreen on a computing device such as a laptop, tablet, mobile phone, etc.).

For the purpose of any U.S. national stage filing from this application, all publications and patents mentioned in this disclosure are incorporated herein by reference in their entireties, for the purpose of describing and disclosing the constructs and methodologies described in those publications, which might be used in connection with the methods of this disclosure. Any publications and patents discussed herein are provided solely for their disclosure prior to the filing date of the present application. Nothing herein is to be construed as an admission that the inventors are not entitled to antedate such disclosure by virtue of prior invention.

In any application before the United States Patent and Trademark Office, the Abstract of this application is provided for the purpose of satisfying the requirements of 37 C.F.R. § 1.72 and the purpose stated in 37 C.F.R. § 1.72(b) "to enable the United States Patent and Trademark Office and the public generally to determine quickly from a cursory inspection the nature and gist of the technical disclosure." Therefore, the Abstract of this application is not intended to be used to construe the scope of the claims or to limit the scope of the subject matter that is disclosed herein. Moreover, any headings that can be employed herein are also not intended to be used to construe the scope of the claims or to limit the scope of the subject matter that is disclosed herein. Any use of the past tense to describe an example otherwise indicated as constructive or prophetic is not intended to reflect that the constructive or prophetic example has actually been carried out.

The present disclosure is further illustrated by the following examples, which are not to be construed in any way as imposing limitations upon the scope thereof. On the contrary, it is to be clearly understood that resort can be had to various other aspects, embodiments, modifications, and equivalents thereof which, after reading the description herein, can be suggest to one of ordinary skill in the art without departing from the spirit of the present invention or the scope of the appended claims.

ADDITIONAL DISCLOSURE

A first embodiment, which is a method of fabricating a microelectronic device comprising:
 providing a substrate comprising a first bottom surface;
 providing a mold comprising a first top surface with first projections; and
 punching the first projections through the first bottom surface to define anchors, pre-cantilevers, and cavities in the substrate.

A second embodiment, which is the method of the first embodiment, further comprising:
 providing a cutter with a second bottom surface with second projections; and
 stamping a second top surface of the substrate to release the pre-cantilevers and define cantilevers and recess areas.

A third embodiment, which is the method of any one of the first through the second embodiments, further comprising fabricating additional circuitry on top of the pre-cantilevers after the providing the substrate, the providing the mold, and the punching.

A fourth embodiment, which is the method of the third embodiment, wherein the fabricating comprises:
 depositing a bottom electrode layer; and
 patterning the bottom electrode layer to define bottom contact pads and bottom electrodes corresponding to the pre-cantilevers.

A fifth embodiment, which is the method of the fourth embodiment, wherein the fabricating further comprises depositing gate dielectric layers.

A sixth embodiment, which is the method of the fifth embodiment, wherein the fabricating further comprises depositing a piezoelectric layer on top of the bottom contact pads, the bottom electrodes, and the gate dielectric layers for thin-film transistors (TFTs).

A seventh embodiment, which is the method of the sixth embodiment, wherein the fabricating further comprises:
 depositing a semiconductor layer on top of the piezoelectric layer; and
 patterning the semiconductor layer to define semiconductor layers for the TFTs.

An eighth embodiment, which is the method of the seventh embodiment, wherein the fabricating further comprises:
 depositing a top electrode layer; and
 patterning the top electrode layer to define top electrodes, connectors, source electrodes for the TFTs, drain electrodes for the TFTs, and top contact pads.

A ninth embodiment, which is the method of the eighth embodiment, wherein the fabricating further comprises removal of the piezoelectric layer to reveal the bottom contact pads.

A tenth embodiment, which is a piezoelectric cantilever actuator system array prepared by a process comprising the steps of:
 providing a substrate comprising a first bottom surface;
 providing a mold comprising a first top surface with first projections; and
 punching the first projections through the first bottom surface to define anchors, pre-cantilevers, and cavities in the substrate.

An eleventh embodiment, which is the system of the tenth embodiment, wherein the process further comprises the steps of:
 providing a cutter with a second bottom surface with second projections; and
 stamping a second top surface of the substrate to release the pre-cantilevers and define cantilevers and recess areas.

A twelfth embodiment, which is the system of any one of the tenth through the eleventh embodiments, wherein the process further comprises the step of fabricating additional circuitry on top of the pre-cantilevers after the providing the substrate, the providing the mold, and the punching.

A thirteenth embodiment, which is the system of the twelfth embodiment, wherein the fabricating comprises:
 depositing a bottom electrode layer;
 patterning the bottom electrode layer to define bottom contact pads and bottom electrodes corresponding to the pre-cantilevers;
 depositing gate dielectric layers; and
 depositing a piezoelectric layer on top of the bottom contact pads, the bottom electrodes, and the gate dielectric layers for thin-film transistors (TFTs).

A fourteenth embodiment, which is the system of the thirteenth embodiment, wherein the fabricating further comprises:
 depositing a semiconductor layer on top of the piezoelectric layer;

patterning the semiconductor layer to define semiconductor layers for the TFTs;
depositing a top electrode layer; and
patterning the top electrode layer to define top electrodes, connectors, source electrodes for the TFTs, drain electrodes for the TFTs, and top contact pads.

A fifteenth embodiment, which is the system of the fourteenth embodiment, wherein the fabricating further comprises removal of the piezoelectric layer reveal the bottom contact pads.

A sixteenth embodiment, which is a microelectronic device comprising:
a base;
a first anchor coupled to the base; and
a first cantilever coupled to the first anchor, wherein the base, the first anchor, and the first cantilever are an integral structure formed from the same substrate material.

A seventeenth embodiment, which is the device of the sixteenth embodiment, further comprising:
a first cavity coupled to the first anchor and the first cantilever; and
a first recess area coupled to the first cantilever and the first cavity.

An eighteenth embodiment, which is the device of the seventeenth embodiment, wherein the first cantilever comprises:
a first bottom surface substantially defining the first cavity;
a first front surface;
a first left surface; and
a first right surface, wherein the first front surface, the first left surface, and the first right surface substantially define the first recess area.

A nineteenth embodiment, which is the device of the eighteenth embodiment, further comprising:
a second anchor coupled to the base and the first recess area;
a second cantilever coupled to the first anchor;
a second cavity coupled to the second anchor and the second cantilever; and
a second recess area coupled to the second cantilever and the second cavity.

A twentieth embodiment, which is the device of any one of the sixteenth through the nineteenth embodiments, further comprising active layers coupled to the first anchor and the first cantilever, configured to form a piezoelectric cantilever actuator with the first cantilever, and comprising:
a bottom electrode;
a piezoelectric layer on top of the bottom electrode; and
a top electrode on top of the piezoelectric layer.

A twenty first embodiment, which is a method of fabricating a microelectronic device having one or more void spaces, comprising:
forming a cavity in a plastically deformable substrate material of the microelectronic device, wherein the substrate has an about uniform upper surface after formation of the cavity, the cavity projects upward into the substrate material from a lower surface of the substrate, and the cavity provides the one or more void spaces in the microelectronics device.

A twenty second embodiment, which is the method of the twenty first embodiment, wherein the microelectronic device is a piezoelectric cantilever actuator.

A twenty third embodiment, which is the method of any one of the twenty first through the twenty-second embodiments, wherein the deformable substrate material is a plastic or polymeric material that undergoes plastic deformation.

A twenty fourth embodiment, which is the method of any one of the twenty first through the twenty third embodiments, further comprising depositing one or more layers of material onto the upper surface of the substrate material to form the microelectronic device, wherein the depositing may occur prior to forming the cavity, after forming the cavity, or both.

A twenty fifth embodiment, which is the method of the twenty fourth embodiment, further comprising cutting from the one or more layers of materials downward through the substrate material.

A twenty sixth embodiment, which is the method of the twenty fifth embodiment, wherein forming the cavity further comprises pressing a mold having one or more projections into the lower surface of the substrate, wherein the projections correspond to the size and shape of the cavity.

A twenty seventh embodiment, which is the method of the twenty sixth embodiment, wherein the cutting further comprises pressing a stamp having cutting blades into the one or more layers of materials downward through the substrate material, wherein the cutting blades correspond to the size and shape of the projections.

A twenty eighth embodiment, which is the method of the twenty seventh embodiment, wherein the projections and the cutting blades interface with respect to the substrate in a complimentary, male-female relationship to form the microelectronic device having the one or more void spaces.

While embodiments of the disclosure have been shown and described, modifications thereof can be made without departing from the spirit and teachings of the invention. The embodiments and examples described herein are exemplary only, and are not intended to be limiting. Many variations and modifications of the invention disclosed herein are possible and are within the scope of the invention.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the detailed description of the present invention. The disclosures of all patents, patent applications, and publications cited herein are hereby incorporated by reference.

What is claimed is:
1. A method of fabricating a microelectronic device comprising:
providing a substrate comprising a first bottom surface;
providing a mold comprising a first top surface with first projections;
punching the first projections through the first bottom surface to define anchors, pre-cantilevers, and cavities in the substrate;
providing a cutter with a second bottom surface with second projections; and
stamping a second top surface of the substrate to release the pre-cantilevers and define cantilevers and recess areas.
2. A method of fabricating a microelectronic device comprising:
providing a substrate comprising a first bottom surface;
providing a mold comprising a first top surface with first projections;

punching the first projections through the first bottom surface to define anchors, pre-cantilevers, and cavities in the substrate;

fabricating additional circuitry on top of the pre-cantilevers after the providing the substrate, the providing the mold, and the punching;

depositing a bottom electrode layer; and patterning the bottom electrode layer to define bottom contact pads and bottom electrodes corresponding to the pre-cantilevers.

3. The method of claim 2, wherein the fabricating further comprises depositing gate dielectric layers.

4. The method of claim 3, wherein the fabricating further comprises depositing a piezoelectric layer on top of the bottom contact pads, the bottom electrodes, and the gate dielectric layers for thin-film transistors (TFTs).

5. The method of claim 4, wherein the fabricating further comprises:

depositing a semiconductor layer on top of the piezoelectric layer; and patterning the semiconductor layer to define TFT semiconductor layers for the TFTs.

6. The method of claim 5, wherein the fabricating further comprises:

depositing a top electrode layer; and patterning the top electrode layer to define top electrodes, connectors, source electrodes for the TFTs, drain electrodes for the TFTs, and top contact pads.

7. The method of claim 6, wherein the fabricating further comprises removal of the piezoelectric layer to reveal the bottom contact pads.

8. A piezoelectric cantilever actuator system array prepared by a process comprising the steps of:

providing a substrate comprising a first bottom surface;

providing a mold comprising a first top surface with first projections;

punching the first projections through the first bottom surface to define anchors, pre-cantilevers, and cavities in the substrate;

providing a cutter with a second bottom surface with second projections; and stamping a second top surface of the substrate to the pre-cantilevers and define cantilevers and recess areas.

9. A piezoelectric cantilever actuator system array prepared by a process comprising the steps of:

providing a substrate comprising a first bottom surface;

providing a mold comprising a first top surface with first projections;

punching the first projections through the first bottom surface to define anchors, pre-cantilevers, and cavities in the substrate;

fabricating additional circuitry on top of the pre-cantilevers after the providing the substrate, the providing the mold, and the punching;

depositing a bottom electrode layer;

patterning the bottom electrode layer to define bottom contact pads and bottom electrodes corresponding to the pre-cantilevers;

depositing gate dielectric layers; and depositing a piezoelectric layer on top of the bottom contact pads, the bottom electrodes, and the gate dielectric layers for thin-film transistors (TFTs).

10. The piezoelectric cantilever actuator system array of claim 9, wherein the fabricating further comprises:

depositing a semiconductor layer on top of the piezoelectric layer;

patterning the semiconductor layer to define TFT semiconductor layers for the TFTs;

depositing a top electrode layer; and patterning the top electrode layer to define top electrodes, connectors, source electrodes for the TFTs, drain electrodes for the TFTs, and top contact pads.

11. The piezoelectric cantilever actuator system array of claim 10, wherein the fabricating further comprises removal of the piezoelectric layer reveal the bottom contact pads.

12. A microelectronic device comprising:

a base;

a first anchor coupled to the base and comprising a first anchor top surface;

a first cantilever coupled to the first anchor and comprising a first cantilever top surface, wherein the base, the first anchor, and the first cantilever are an integral structure formed from the same substrate material;

a first set of active layers coupled to the first anchor and the first cantilever, configured to form a first piezoelectric cantilever actuator with the first cantilever, and covering part of the first anchor top surface and all of the first cantilever top surface;

a second anchor coupled to the base and comprising a second anchor top surface;

a second cantilever coupled to the second anchor and comprising a second cantilever top surface; and a second set of active layers coupled to the second anchor and the second cantilever, configured to form a second piezoelectric cantilever actuator with the second cantilever, and covering part of the second anchor top surface and all of the second cantilever top surface.

13. The microelectronic device of claim 12, further comprising:

a first cavity coupled to the first anchor and the first cantilever; and a first recess area coupled to the first cantilever and the first cavity.

14. The microelectronic device of claim 13, wherein the first cantilever comprises:

a first bottom surface substantially defining the first cavity;

a first front surface;

a first left surface; and a first right surface, wherein the first front surface, the first left surface, and the first right surface substantially define the first recess area.

15. The microelectronic device of claim 14, further comprising:

a second cavity coupled to the second anchor and the second cantilever; and a second recess area coupled to the second cantilever and the second cavity, wherein the second anchor is further coupled to the first recess area.

16. The microelectronic device of claim 12, wherein the first set and the second set comprise:

a bottom electrode;

a piezoelectric layer on top of the bottom electrode; and a top electrode on top of the piezoelectric layer.

* * * * *